(12) United States Patent
Pickett et al.

(10) Patent No.: US 7,867,557 B2
(45) Date of Patent: *Jan. 11, 2011

(54) NANOPARTICLES

(75) Inventors: Nigel Pickett, East Croyden (GB); Steven Daniels, Manchester (GB); Paul O'Brien, High Peak (GB)

(73) Assignee: Nanoco Technologies Limited, Manchester (GB)

( * ) Notice: Subject to any disclaimer, the term of this patent is extended or adjusted under 35 U.S.C. 154(b) by 168 days.

This patent is subject to a terminal disclaimer.

(21) Appl. No.: 11/997,973

(22) PCT Filed: Aug. 14, 2006

(86) PCT No.: PCT/GB2006/003028

§ 371 (c)(1),
(2), (4) Date: Feb. 5, 2008

(87) PCT Pub. No.: WO2007/020416

PCT Pub. Date: Feb. 22, 2007

(65) Prior Publication Data

US 2008/0220593 A1  Sep. 11, 2008

(30) Foreign Application Priority Data

Aug. 12, 2005  (GB) ................ 0516598.0

(51) Int. Cl.
C30B 7/00 (2006.01)
B82B 3/00 (2006.01)
(52) U.S. Cl. .............. 427/214; 427/212; 427/215; 428/402; 428/403; 428/404; 428/405; 428/406
(58) Field of Classification Search .............. 257/14; 427/212, 214, 215; 428/403, 404, 405
See application file for complete search history.

(56) References Cited

U.S. PATENT DOCUMENTS 2,769,838 A  11/1956  Matter et al.

(Continued)

FOREIGN PATENT DOCUMENTS

CN  1394599  2/2003

(Continued)

OTHER PUBLICATIONS

Zhong et al., "Composition-Tunable ZnxCu1-xSe Nanocrystals with High Luminescence and Stability", Journal of American Chemical Society. (2003).*

(Continued)

*Primary Examiner*—Michael Cleveland
*Assistant Examiner*—Lisha Jiang
(74) *Attorney, Agent, or Firm*—Bingham McCutchen LLP

(57) ABSTRACT

Method for producing a nanoparticle comprised of core, first shell and second shell semiconductor materials. Effecting conversion of a core precursor composition comprising separate first and second precursor species to the core material and then depositing said first and second shells. The conversion is effected in the presence of a molecular cluster compound under conditions permitting seeding and growth of the nanoparticle core. Core/multishell nanoparticles in which at least two of the core, first shell and second shell materials incorporate ions from groups 12 and 15, 14 and 16, or 11, 13 and 16 of the periodic table. Core/multishell nanoparticles in which the second shell material incorporates at least two different group 12 ions and group 16 ions. Core/multishell nanoparticles in which at least one of the core, first and second semiconductor materials incorporates group 11, 13 and 16 ions and the other semiconductor material does not incorporate group 11, 13 and 16 ions.

17 Claims, 12 Drawing Sheets

U.S. PATENT DOCUMENTS

| | | | |
|---|---|---|---|
| 3,524,771 A * | 8/1970 | Green | 136/203 |
| 4,609,689 A | 9/1986 | Schwartz et al. | |
| 6,114,038 A | 9/2000 | Castro et al. | |
| 6,207,229 B1 | 3/2001 | Bawendi et al. | |
| 6,221,602 B1 | 4/2001 | Barbera-Guillem et al. | |
| 6,261,779 B1 | 7/2001 | Barbera-Guillem et al. | |
| 6,322,901 B1 | 11/2001 | Bawendi et al. | |
| 6,326,144 B1 | 12/2001 | Bawendi et al. | |
| 6,333,110 B1 | 12/2001 | Barbera-Guillem | |
| 6,379,635 B2 | 4/2002 | O'Brien et al. | |
| 6,423,551 B1 | 7/2002 | Weiss et al. | |
| 6,426,513 B1 | 7/2002 | Bawendi et al. | |
| 6,607,829 B1 | 8/2003 | Bawendi et al. | |
| 6,660,379 B1 | 12/2003 | Lakowicz et al. | |
| 6,699,723 B1 | 3/2004 | Weiss et al. | |
| 6,815,064 B2 * | 11/2004 | Treadway et al. | 428/403 |
| 6,855,551 B2 | 2/2005 | Bawendi et al. | |
| 6,914,264 B2 | 7/2005 | Chen et al. | |
| 7,041,362 B2 | 5/2006 | Barbera-Guillem | |
| 7,151,047 B2 | 12/2006 | Chan et al. | |
| 7,235,361 B2 | 6/2007 | Bawendi et al. | |
| 7,264,527 B2 | 9/2007 | Bawendi et al. | |
| 2003/0017264 A1 | 1/2003 | Treadway et al. | |
| 2003/0106488 A1 | 6/2003 | Huang et al. | |
| 2003/0148024 A1 | 8/2003 | Kodas et al. | |
| 2004/0007169 A1 | 1/2004 | Ohtsu et al. | |
| 2004/0110002 A1 | 6/2004 | Kim et al. | |
| 2004/0110347 A1 | 6/2004 | Yamashita | |
| 2004/0178390 A1 | 9/2004 | Whiteford et al. | |
| 2004/0250745 A1 | 12/2004 | Ogura et al. | |
| 2005/0129947 A1 * | 6/2005 | Peng et al. | 428/403 |
| 2005/0145853 A1 | 7/2005 | Sato et al. | |
| 2006/0019098 A1 | 1/2006 | Chan et al. | |
| 2006/0061017 A1 | 3/2006 | Strouse et al. | |
| 2006/0068154 A1 | 3/2006 | Parce et al. | |
| 2006/0118757 A1 | 6/2006 | Klimov et al. | |
| 2006/0130741 A1 | 6/2006 | Peng et al. | |
| 2007/0012941 A1 | 1/2007 | Cheon | |
| 2007/0034833 A1 | 2/2007 | Parce et al. | |
| 2007/0059705 A1 | 3/2007 | Lu et al. | |
| 2007/0104865 A1 * | 5/2007 | Pickett | 427/212 |
| 2007/0110816 A1 | 5/2007 | Jun et al. | |
| 2007/0114520 A1 | 5/2007 | Garditz et al. | |
| 2007/0125983 A1 | 6/2007 | Treadway et al. | |
| 2007/0131905 A1 | 6/2007 | Sato et al. | |
| 2007/0199109 A1 | 8/2007 | Yi et al. | |
| 2007/0202333 A1 | 8/2007 | O'Brien et al. | |
| 2007/0238126 A1 | 10/2007 | Pickett et al. | |
| 2008/0107911 A1 | 5/2008 | Liu et al. | |
| 2008/0112877 A1 | 5/2008 | Xiao et al. | |
| 2008/0121844 A1 | 5/2008 | Jang et al. | |
| 2008/0160306 A1 | 7/2008 | Mushtaq et al. | |
| 2008/0220593 A1 | 9/2008 | Pickett et al. | |
| 2008/0257201 A1 | 10/2008 | Harris et al. | |
| 2008/0264479 A1 | 10/2008 | Harris et al. | |
| 2009/0139574 A1 | 6/2009 | Pickett et al. | |
| 2009/0212258 A1 | 8/2009 | McCairn et al. | |
| 2009/0263816 A1 | 10/2009 | Pickett et al. | |
| 2010/0059721 A1 | 3/2010 | Pickett et al. | |
| 2010/0068522 A1 | 3/2010 | Pickett et al. | |
| 2010/0113813 A1 | 5/2010 | Pickett et al. | |
| 2010/0123155 A1 | 5/2010 | Pickett et al. | |
| 2010/0193767 A1 | 8/2010 | Naasani et al. | |

FOREIGN PATENT DOCUMENTS

| | | |
|---|---|---|
| EP | 1783137 A1 | 5/2007 |
| EP | 1854792 A1 | 11/2007 |
| GB | 9518910.6 | 9/1995 |
| GB | 2429838 A | 3/2007 |
| JP | 2005/139389 | 6/2005 |
| WO | WO-97/10175 | 3/1997 |
| WO | WO-00/17642 | 3/2000 |
| WO | WO-02/04527 | 1/2002 |
| WO | WO-0224623 A2 | 3/2002 |
| WO | WO-02/29140 | 4/2002 |
| WO | WO-03/099708 | 12/2003 |
| WO | WO-2004008550 A2 | 1/2004 |
| WO | WO-2004/033366 | 4/2004 |
| WO | WO-2004/066361 | 8/2004 |
| WO | WO-2004065362 A2 | 8/2004 |
| WO | WO-2005/021150 | 3/2005 |
| WO | WO-2005/106082 | 11/2005 |
| WO | WO-2005106082 A1 | 11/2005 |
| WO | WO-2005123575 A1 | 12/2005 |
| WO | WO-2006001848 A2 | 1/2006 |
| WO | WO-2006/017125 | 2/2006 |
| WO | WO-2006075974 A1 | 7/2006 |
| WO | WO-2006/116337 | 11/2006 |
| WO | WO-2006118543 A1 | 11/2006 |
| WO | WO-2006134599 A1 | 12/2006 |
| WO | WO-2007020416 A1 | 2/2007 |
| WO | WO-2007/049052 | 5/2007 |
| WO | WO-2007/060591 | 5/2007 |
| WO | WO-2007-060591 A | 5/2007 |
| WO | WO-2007049052 A2 | 5/2007 |
| WO | WO-2007/065039 | 6/2007 |
| WO | WO-2007102799 A2 | 9/2007 |
| WO | WO-2008013780 A2 | 1/2008 |
| WO | WO-2008054874 A2 | 5/2008 |
| WO | WO-2008133660 A2 | 11/2008 |
| WO | WO-2009016354 A1 | 2/2009 |
| WO | WO-20090106810 A1 | 9/2009 |

OTHER PUBLICATIONS

Cumberland et al., "Inorganic Clusters as Single-Source Precursors for Preparation of CdSe, ZnSe, and CdSe/ZnS Nanomaterials," Chemistry of Materials (2002).*

Sheng et al., "In-Situ Encapsulation of Quantum Dots into Polymer Microspheres", Langmuir, (2006), vol. 22(8), pp. 3782-3790.*

Agger, J.R. et al., J. Phys. Chem. B (1998) 102, p. 3345.

Aldana, J. et al. "Photochemical Instability of CdSe Nanocrystals Coated by Hydrophilic Thiols", J. Am. Chem. Soc. (2001), 123: 8844-8850.

Alivisatos, A.P. "Perspectives on the Physical Chemistry of Semiconductor Nanocrystals", J. Phys. Chem., (1996), 100, pp. 13226-13239.

Arici et al., Thin Solid Films 451-452 (2004) 612-618.

Battaglia et al., "Colloidal Two-dimensional Systems: CdSe Quantum Shells and Wells," Angew Chem. (2003) 115:5189.

Bawendi, M.G. The Quantum Mechanics of Larger Semiconductor Clusters ("Quantum Dots"), Annu. Rev. Phys. Chem. (1990), 42: 477-498.

Berry, C.R. "Structure and Optical Absorption of AgI Microcrystals", Phys. Rev. (1967) 161: 848-851.

Bunge, S.D. et al. "Growth and morphology of cadmium chalcogenides: the synthesis of nanorods, tetrapods, and spheres from CdO and $Cd(O_2CCH_3)_2$", J. Mater. Chem. (2003) 13: 1705-1709.

Castro et al., Chem. Mater. (2003) 15:3142-3147.

Castro et al., "Synthesis and Characterization of Colloidal $CuInS_2$ Nanoparticles from a Molecular Single-Source Precursors," J. Phys. Chem. B (2004) 108:12429.

Chun et al., Thin Solid Films 480-481 (2005) 46-49.

Contreras et al., "ZnO/ZnS(O,OH)/Cu(In,Ga)$Se_2$/Mo Solar Cell with 18:6% Efficiency," from 3d World Conf. on Photovol. Energy Conv., Late News Paper, (2003) pp. 570-573.

Cui et al., "Harvest of near infrared light in PbSe nanocrystal-polymer hybrid photovoltaic cells," Appl. Physics Lett. 88 (2006) 183111-183111-3.

Cumberland et al., "Inorganic Clusters as Single-Source Precursors for Preparation of CdSe, ZnSe, and CdSe/ZnS Nanomaterials" Chemistry of Materials, 14, pp. 1576-1584, (2002).

Dance et al., J. Am. Chem. Soc. (1984) 106:6285.

Daniels et al., "New Zinc and Cadmium Chalcogenide Structured Nanoparticles," Mat. Res. Soc. Symp. Proc. 789 (2004).

Eychmüller, A. et al. "A quantum dot quantum well: CdS/HgS/CdS", Chem. Phys. Lett. 208, pp. 59-62 (1993).

Fendler, J.H. et al. "The Colloid Chemical Approach to Nanostructured Materials", Adv. Mater. (1995) 7: 607-632.

Gao, M. et al. "Synthesis of PbS Nanoparticles in Polymer Matrices", J. Chem. Soc. Commun. (1994) pp. 2779-2780.

Gou et al., J. Am. Chem. Soc. (2006) 128:7222-7229.

Gur et al., "Air stable all-inorganic nanocrystal solar cells processed from solution," Lawrence Berkeley Natl. Lab., Univ. of California, paper LBNL-58424 (2005).

Gurin, Colloids Surf. A (1998) 142:35-40.

Guzelian, A. et al. "Colloidal chemical synthesis and characterization of InAs nanocrystal quantum dots", Appl. Phys. Lett. (1996) 69: 1432-1434.

Guzelian, A. et al., J. Phys. Chem. (1996) 100: 7212.

Hagfeldt, A. et al. "Light-induced Redox Reactions in Nanocrystalline Systems", Chem. Rev. (1995) 95: 49-68.

Henglein, A. "Small-Particle Research: Physicochemical Properties of Extremely Small Colloidal Metal and Semiconductor Particles", Chem Rev. (1989) 89: 1861-1873.

Hirpo et al., "Synthesis of Mixed Copper-Indium Chalcogenolates. Single-Source Precursors for the Photovoltaic Materials $CuInQ_2$ (Q=S, Se)," J. Am. Chem. Soc. (1993) 115:1597.

Hu et al., Sol. State Comm. (2002) 121:493-496.

International Search Report for PCT/GB2005/001611 mailed Sep. 8, 2005 (5 pages).

Jegier, J.A. et al. "Poly(imidogallane): Synthesis of a Crystalline 2-D Network Solid and Its Pyrolysis To Form Nanocrystalline Gallium Nitride in Supercritical Ammonia", Chem. Mater. (1998) 10: 2041-2043.

Jiang et al., Inorg. Chem. (2000) 39:2964-2965.

Kaelin et al., "CIS and CIGS layers from selenized nanoparticle precursors," Thin Solid Films 431-432 (2003) pp. 58-62.

Kapur et al., "Non-Vacuum processing of $CuIn_{1-x}Ga_xSe_2$ solar cells on rigid and flexible substrates using nanoparticle precursor inks," Thin Solid Films 431-432 (2003) pp. 53-57.

Kher, S. et al. "A Straightforward, New Method for the Synthesis of Nanocrystalline GaAs and GaP", Chem. Mater. (1994) 6: 2056-2062.

Kim et al., J. Mech. Sci. Tech. (2005) 19:2085-2090.

Law et al., "Nanowire dye-sensitized solar cells," Nature Mater. (2005) vol. 4 pp. 455-459.

Li et al., Adv. Mat. (1999) 11:1456-1459.

Lieber, C. et al. "Understanding and Manipulating Inorganic Materials with Scanning Probe Microscopes", Angew. Chem. Int. Ed. Engl. (1996) 35: 687-704.

Little et al., "Formation of Quantum-dot quantum-well heteronanostructures with large lattice mismatch: Zn/CdS/ZnS," 114 J. Chem. Phys. 4 (2001).

Lu et al., Inorg. Chem. (2000) 39:1606-1607.

LØver, T. et al. "Preparation of a novel CdS nanocluster material from a thiophenolate-capped CdS cluster by chemical removal of SPh ligands", J. Mater. Chem. (1997) 7(4): 647-651.

Malik et al., Adv. Mat., (1999) 11:1441-1444.

Matijevic, E., "Monodispersed Colloids: Art and Science", Langmuir (1986) 2:12-20.

Matijevic, E. "Production of Mondispersed Colloidal Particles", Ann. Rev. Mater. Sci. (1985) 15: 483-518.

Mekis, I. et al., "One-Pot Synthesis of Highly Luminescent CdSe/CdS Core-Shell Nanocrystals via Organometallic and "Greener" Chemical Approaches", J. Phys. Chem. B. (2003) 107: 7454-7462.

Mews et al., J. Phys. Chem. (1994) 98:934.

Micic et al., "Synthesis and Characterization of InP, GaP, and $GaInP_2$ Quantum Dots", J. Phys. Chem. (1995) pp. 7754-7759.

Milliron et al., "Electroactive Surfactant Designed to Mediate Electron Transfer between CdSe Nanocrystals and Organic Semiconductors," Adv. Materials (2003) 15, No. 1, pp. 58-61.

Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.

Nairn et al., Nano Letters (2006) 6:1218-1223.

Nazeeruddin et al., "Conversion of Light to Electricity by cis-X2Bis(2,2'bipyridyl-4,4'-dicarboxylate)ruthenium(II) Charge-Transfer Sensitizers (X=Cl-, Br-, I-, CN-, and SCN-) on Nanocrystalline $TiO_2$ Electrodes," J. Am. Chem. Soc. (1993) 115:6382-6390.

Nazeeruddin et al., "Engineering of Efficient Panchromatic Sensitizers for Nanocrystalline TiO2-Based Solar Cells," J. Am. Chem. Soc. (2001) 123:1613-1624.

O'Brien et al., "The Growth of Indium Selenide Thin Films from a Novel Asymmetric Dialkydiselenocarbamate," 3 Chem. Vap. Depos. 4, pp. 227 (1979).

Olshaysky, M.A., et al. "Organometallic Synthesis of GaAs Crystallites Exhibiting Quantum Confinement", J. Am. Chem. Soc. (1990) 112: 9438-9439.

Olson et al., J. Phys. Chem. C. (2007) 111:16640-16645.

Patents Act 1977: Search Report under Section 17 for Application No. GB0409877.8 dated Oct. 7, 2004 (2 pages).

Patent Act 1977 Search Report under Section 17 for Application No. GB0522027.2 dated Jan. 27, 2006 (1 page).

Patent Act 1977 Search Report under Section 17 for Application No. GB0606845.6 dated Sep. 14, 2006.

Patent Act 1977 Search Report under Section 17 for Application No. GB0719073.9.

Patent Act 1977 Search Report under Section 17 for Application No. GB0719075.4.

Patent Act 1977 Search Report under Section 17 for Application No. GB0723539.3 dated Mar. 27, 2008 (1 page).

Peng et al., J. Am. Chem. Soc. (2001) 123:1389.

Peng et al., "Kinetics of I-VI and III-V Colloidal Semiconductor Nanocrystal Growth: "Focusing" os Size Distributions", J. Am. Chem. Soc., (1998) 129: 5343-5344.

Peng et al., "Shape control of CdSe nanocrystals", Nature, (2000) vol. 404, No. 6773, pp. 59-61.

Pradhan, N. et al. "Single-Precursor, One-Pot Versatile Synthesis under near Ambient Conditions of Tunable, Single and Dual Band Flourescing Metal Sulfide Nanoparticles", J. Am. Chem. Soc. (2003) 125: 2050-2051.

Qi et al., "Efficient polymer-nanocrystal quantum-dot photodetectors," Appl. Physics Lett. 86 (2005) 093103-093103-3.

Qu, L. et al. "Alternative Routes toward High Quality CdSe Nanocrystals", Nano Lett. (2001) vol. 1, No. 6, pp. 333-337.

Robel et al., "Quantum Dot Solar Cells. Harvesting Light Energy with CdSe Nanocrystals Molecularly Linked to Mesoscopic TiO2 Films," J. Am. Chem. Soc. (2006) 128: 2385-2393.

Salata, O.V. et al. "Uniform GaAs quantum dots in a polymer matrix", Appl. Phys. Letters (1994) 65(2): 189-191.

Sercel, P.C. et al. "Nanometer-scale GaAs clusters from organometallic percursors", Appl. Phys. Letters (1992) 61: 696-698.

Shulz et al., J. Elect. Mat. (1998) 27:433-437.

Steigerwald, M.L. et al. "Semiconductor Crystallites: A Class of Large Molecules", Acc. Chem. Res. (1990) 23: 183-188.

Stroscio, J.A. et al. "Atomic and Molecular Manipulation with the Scanning Tunneling Microscope", Science (1991), 254: 1319-1326.

Trinidade et al., "A Single Source Spproach to the Synthesis of CdSe Nanocrystallites", Advanced Materials, (1996) vol. 8, No. 2, pp. 161-163.

Vayssieres et al., "Highly Ordered $SnO_2$ Nanorod Arrays from Controlled Aqueous Growth," Angew. Chem. Int. Ed. (2004) 43: 3666-3670.

Wang Y. et al. "PbS in polymers, From molecules to bulk solids", J. Chem. Phys. (1987) 87: 7315-7322.

Weller, H. "Colloidal Semiconductor Q-Particles: Chemistry in the Transition Region Between Solid State and Molecules", Angew. Chem. Int. Ed. Engl. (1993) 32: 41-53.

Weller, H. "Quantized Semiconductor Particles: A Novel State of Mater for Materials Science", Adv. Mater. (1993) 5: 88-95.

Wells, R.L. et al. "Synthesis of Nanocrystalline Indium Arsenide and Indium Phosphide from Indium(III) Halides and Tris(trimethylsilyl)pnicogens. Synthesis, Characterization, and Decomposition Behavior of $I_3In-P(SiMe_3)_3$", Chem. Mater. (1995) 7: 793-800.

Xiao et al., J. Mater. Chem. (2001) 11:1417-1420.

Yang et al., Crystal Growth & Design (2007) 12:2562-2567.

Yu et al., "Polymer Photovoltaic Cells: Enhanced Efficiencies via a Network of Internal Donor-Acceptor Heterojunctions," 270 Science 5243 (1995), pp. 1789-1791.

Zhong et al., Nanotechnology 18 (2007) 025602.

Barron, "Group III Materials: New Phases and Nono-particles with Applications in Electronics and Optoelectronics," Office of Naval Research Final Report (1999).

Dabousi et al., "(CdSe)ZnS Core—Shell Quantum Dots: Synthesis and Characterization of a Size Series of Highly Luminescent Nanocrystallites," Jrl. Phys. Chem.,(1997) 101, pp. 9463-9475.

Dehnen et al., "Chalcogen-Bridged Copper Clusters," Eur. J. Inorg. Chem., (2002) pp. 279-317.

Eisenmann et al., "New Phosphido-bridged Multinuclear Complexes of Ag and Zn," Zeitschrift fur anorganische und allgemeine Chemi (1995). (1 page—abstract).

Huang et al., "Bio-Inspired Fabrication of Antireflection Nanostructures by Replicating Fly Eyes" *Nanotechnology* (2008) vol. 19.

International Search Report for PCT/GB2006/003028 mailed Jan. 22, 2007 (5 pages).

International Search Report for PCT/GB2009/001928 mailed Dec. 8, 2009 (3 pages).

International Search Report for PCT/GB2009/002605 mailed Feb. 22, 2010 (3 pages).

Kim et al. "Engineering InAsxP1-x/InP/ZnSe III-V Alloyed Core-Shell Quantum Dots for the Near-Infrared" JACS Articles published on web Jul. 8, 2005.

Materials Research Society Symposium Proceedings *Quantum Dots, Nanoparticles and Nanowires*, 2004, ISSN: 0272-9172.

Müller et al., "From Giant Molecular Clusters and Precursors to Solid-state Structures," *Current Opinion in Solid State and Materials Science*, 4 (Apr. 1999) pp. 141-153.

Nielsch et al., "Uniform Nickel Deposition into Ordered Alumina Pores by Pulsed Electrodeposition", *Advanced Materials*, 2000 vol. 12, No. 8, pp. 582-586.

Rao et al. (2004) "The Chemistry of Nanomaterials: Synthesis, Properties and Applications" p. 443.

Search Report for GB0813273.0 searched Dec. 8, 2008 (1 page).
Search Report for GB0814458.6 searched Dec. 5, 2008 (1 page).
Search Report for GB0820101.4 searched Mar. 3, 2009 (1 page).
Search Report for GB0821122.9 searched Mar. 19, 2009 (2 pages).

Trinidade et al., "Nanocrystalline Semiconductors: Synthesis, Properties, and Perspectives", Chemistry of Materials, (2001) vol. 13, No. 11, pp. 3843-3858.

Vittal, "The chemistry of inorganic and organometallic compounds with adameantane-like structures," Polyhedron, vol. 15, No. 10, pp. 1585-1642 (1996).

Xie et al. "Synthesis and Characterization of Highly Luminescent CdSe-Core CdS/Zn0.5Cd0.5S/ZnS Multishell Nanocrystals" JACS Articles published on web Apr. 29, 2005.

Zhong et al, "Composition-Tunable $Zn_xCu_{1-x}Se$ Nanocrytals with High Luminescence and Stability", Jrl Amer. Chem. Soc. (2003).

Foneberov et al., (2005) "Photoluminescence of tetrahedral quantum-dot quantum wells" Physica E, 26:63-66.

Cao, (2005) "Effect of Layer Thickness on the Luminescence Properties of ZnS/CdS/ZnS quantum dot quantum well", J. of Colloid and Interface Science 284:516-520.

Harrison et al. (2000) "Wet Chemical Synthesis on Spectroscopic Study of CdHgTe Nanocrystals with Strong Near-Infrared Luminescence" Mat. Sci and Eng.B69-70:355-360.

Sheng et al. (2006) "In-Situ Encapsulation of Quantum Dots into Polymer Microspheres", Langmuir 22(8):3782-3790.

Timoshkin, "Group 13 imido metallanes and their heavier analogs [RMYR']n (M=Al, Ga, In; Y=N, P, As, Sb)," Coordination Chemistry Reviews (2005).

W. Peter Wuelfing et al: "Supporting Information for Nanometer Gold Clusters Protected by Surface Bound Monolayers of Thiolated Poly (ethylene glycol) Polymer Electrolyte" Journal of the American Chemical Society (XP002529160), (1998).

International Search Report for PCT/GB2009/000510 mailed Jul. 6, 2010 (16 pages).

* cited by examiner (a)

(b)

(c)

NANOPARTICLES

This application is the U.S. national stage application of International (PCT) Patent Application Serial No. PCT/GB2006/003028, filed Aug. 14, 2006, which claims the benefit of GB Application No. 0516598.0, filed Aug. 12, 2005. The entire disclosures of these two applications are hereby incorporated by reference as if set forth at length herein in their entirety.

The present invention relates to nanoparticles and methods for preparing nanoparticles.

BACKGROUND

There has been substantial interest in the preparation and characterisation of compound semiconductors comprising of particles with dimensions in the order of 2-100 nm, often referred to as quantum dots and nanocrystals mainly because of their optical, electronic or chemical properties. These interests have occurred mainly due to their size-tunable electronic, optical and chemical properties and the need for the further miniaturization of both optical and electronic devices that now range from commercial applications as diverse as biological labelling, solar cells, catalysis, biological imaging, light-emitting diodes amongst many new and emerging applications.

Although some earlier examples appear in the literature, recently methods have been developed from reproducible "bottom up" techniques, whereby particles are prepared atom-by-atom, i.e. from molecules to clusters to particles using "wet" chemical procedures. Rather from "top down" techniques involving the milling of solids to finer and finer powders.

To-date the most studied and prepared of nano-semiconductor materials have been the chalcogenides II-VI materials namely ZnS, ZnSe, CdS, CdSe, CdTe; most noticeably CdSe due to its tunability over the visible region of the spectrum. Semiconductor nanoparticles are of academic and commercial interest due to their differing and unique properties from those of the same material, but in the macro crystalline bulk form. Two fundamental factors, both related to the size of the individual nanoparticle, are responsible for these unique properties.

The first is the large surface to volume ratio; as a particle becomes smaller, the ratio of the number of surface atoms to those in the interior increases. This leads to the surface properties playing an important role in the overall properties of the material.

The second factor is that, with semiconductor nanoparticles, there is a change in the electronic properties of the material with size, moreover, the band gap gradually becoming larger because of quantum confinement effects as the size of the particles decreases. This effect is a consequence of the confinement of an 'electron in a box' giving rise to discrete energy levels similar to those observed in atoms and molecules, rather than a continuous band as in the corresponding bulk semiconductor material. For a semiconductor nanoparticle, because of the physical parameters, the "electron and hole", produced by the absorption of electromagnetic radiation, a photon, with energy greater then the first excitonic transition, are closer together than in the corresponding macrocrystalline material, so that the Coulombic interaction cannot be neglected. This leads to a narrow bandwidth emission, which is dependent upon the particle size and composition. Thus, quantum dots have higher kinetic energy than the corresponding macrocrystalline material and consequently the first excitonic transition (band gap) increases in energy with decreasing particle diameter.

The coordination about the final inorganic surface atoms in any core, core-shell or core-multi shell nanoparticles is incomplete, with highly reactive "dangling bonds" on the surface, which can lead to particle agglomeration. This problem is overcome by passivating (capping) the "bare" surface atoms with protecting organic groups. The capping or passivating of particles not only prevents particle agglomeration from occurring, it also protects the particle from its surrounding chemical environment, along with providing electronic stabilization (passivation) to the particles in the case of core material.

The capping agent usually takes the form of a Lewis base compound covalently bound to surface metal atoms of the outer most inorganic layer of the particle, but more recently, so as to incorporate the particle into a composite, an organic system or biological system can take the form of, an organic polymer forming a sheaf around the particle with chemical functional groups for further chemical synthesis, or an organic group bonded directly to the surface of the particle with chemical functional groups for further chemical synthesis.

Single core nanoparticles, which consist of a single semiconductor material along with an outer organic passivating layer, tend to have relatively low quantum efficiencies due to electron-hole recombination occurring at defects and dangling bonds situated on the nanoparticle surface which lead to non-radiative electron-hole recombinations.

One method to eliminate defects and dangling bonds is to grow a second material, having a wider band-gap and small lattice mismatch with the core material, epitaxially on the surface of the core particle, (e.g. another II-VI material) to produce a "core-shell particle". Core-shell particles separate any carriers confined in the core from surface states that would otherwise act as non-radiative recombination centres. One example is ZnS grown on the surface of CdSe cores. The shell is generally a material with a wider bandgap then the core material and with little lattice mismatch to that of the core material, so that the interface between the two materials has as little lattice strain as possible. Excessive strain can further result in defects and non-radiative electron-hole recombination resulting in low quantum efficiencies.

Quantum Dot-Quantum Wells

Another approach which can further enhance the efficiencies of semiconductor nanoparticles is to prepare a core-multi shell structure where the "electron-hole" pair are completely confined to a single shell such as a quantum dot-quantum well structure. Here, the core is of a wide bandgap material, followed by a thin shell of narrower bandgap material, and capped with a further wide bandgap layer, such as CdS/HgS/CdS grown using a substitution of Hg for Cd on the surface of the core nanocrystal to deposit just a few monolayer of HgS. The resulting structures exhibited clear confinement of photoexcited carriers in the HgS. Other known Quantum dot quantum well (QDQW) structures include—ZnS/CdSe/ZnS, CdS/CdSe/CdS and ZnS/CdS/ZnS.

Colloidally grown QD-QW nanoparticles are relatively new. The first and hence most studied systems were of CdS/HgS/CdS grown by the substitution of cadmium for mercury on the core surface to deposit one monolayer of HgS. A wet chemical synthetic method for the preparation of spherical CdS/HgS/CdS quantum wells was presented with a study of their unique optical properties. The CdS/HgS/CdS particles emitted a red band-edge emission originating from the HgS layer. Little et al. have grown ZnS/CdS/ZnS QDQWs using a similar growth technique to that of Eychmüller to show that these structure can be made despite the large lattice mismatch (12%) between the two materials, ZnS and CdS. Daniels et al produced a series of structures that include ZnS/CdSe/ZnS, ZnS/CdS/CdSe/ZnS, ZnS/CdSe/CdS/ZnS, ZnS/CdS/CdSe/CdS/ZnS. The aim of this work was to grow strained nanocrystalline heterostructures and to correlate their optical properties with modelling that suggested that there is relocation of the carriers (hole/electron) from confinement in the ZnS core to the CdSe shell. CdS/CdSe/CdS QDQW's, have also been produced by Peng et al. although this structure is promising, the small CdS band gap may not be sufficient to prevent the escape of electrons to the surface.[5,6,7,8]

Although there are now a number of methods for preparing core-shell quantum dots, where it has been shown and reported for the reaction solutions containing the quantum dots, core-shell quantum dots can have quantum yields as high as 90%. However, it is well known that once one tries to manipulate the freshly made solutions of core-shell quantum dots such as isolating the particles as dry powders, upon re-dissolving the particles quantum yields can be substantially lower (sometimes as low as 1-5%).

According to a first aspect of the present invention there is provided a method for producing a nanoparticle comprised of a core comprising a core semiconductor material, a first layer comprising a first semiconductor material provided on said core and a second layer comprising a second semiconductor material provided on said first layer, said core semiconductor material being different to said first semiconductor material and said first semiconductor material being different to said second semiconductor material, wherein the method comprises effecting conversion of a nanoparticle core precursor composition to the material of the nanoparticle core, depositing said first layer on said core and depositing said second layer on said first layer, said core precursor composition comprising a first precursor species containing a first ion to be incorporated into the growing nanoparticle core and a separate second precursor species containing a second ion to be incorporated into the growing nanoparticle core, said conversion being effected in the presence of a molecular cluster compound under conditions permitting seeding and growth of the nanoparticle core.

This aspect of the present invention relates to a method of producing core/multishell nanoparticles of any desirable form and allows ready production of a monodisperse population of such particles which are consequently of a high purity. It is envisaged that the invention is suitable for producing nanoparticles of any particular size, shape or chemical composition. A nanoparticle may have a size falling within the range 2-100 nm. A sub-class of nanoparticles of particular interest is that relating to compound semiconductor particles, also known as quantum dots or nanocrystals.

The current invention concerns the large scale synthesis of nanoparticles by the reaction whereby a seeding molecular cluster is placed in a dispersing medium or solvent (coordinating or otherwise) in the presence of other precursors to initiate particle growth. The invention uses a seeding molecular cluster as a template to initiate particle growth from other precursors present within the reaction medium. The molecular cluster to be used as the seeding agent can either be prefabricated or produced in situ prior to acting as a seeding agent.

Although manipulation of freshly made solutions of core-shell quantum dots can substantially lower the particles' quantum yields, by using a core-multishell architecture rather than known core-shell structures, more stable nanoparticles (to both chemical environment and photo effects) can be produced. It will be appreciated that while the first aspect of the present invention defines a method for producing nanoparticles having a core, and first and second layers, the method forming the first aspect of the present invention may be used to provide nanoparticles comprising any desirable number of additional layers (e.g. third, fourth and fifth layers provides on the second, third and fourth layers respectively) of pure or doped semiconductor materials, materials having a ternary or quaternary structure, alloyed materials, metallic materials or non-metallic materials. The invention addresses a number of problems, which include the difficulty of producing high efficiency blue emitting dots.

The nanoparticle core, first and second semiconductor materials may each possess any desirable number of ions of any desirable element from the periodic table. Each of the core, first and second semiconductor material is preferably separately selected from the group consisting of a semiconductor material incorporating ions from groups 12 and 15 of the periodic table, a semiconductor material incorporating ions from groups 13 and 15 of the periodic table, a semiconductor material incorporating ions from groups 12 and 16 of the periodic table, a semiconductor material incorporating ions from groups 14 and 16 of the periodic table and a semiconductor material incorporating ions from groups 11, 13 and 16 of the periodic table.

Thus, while at least one of the core, first and second semiconductor materials may incorporate ions from groups 12 and 15 of the periodic table, the material(s) used in these layers may include ions of one or more further elements, for example, more than one element from group 12 and/or group 15 of the periodic table and/or ions from at least one different group of the periodic table. A preferred core/multishell architecture comprises at least one layer incorporating two different types of group 12 ions (e.g. Cd and Zn, or Cd and Hg) and group 16 ions (e.g. S, Se or Te).

In the nanoparticle of the present invention where at least one of the core, first and second semiconductor materials is selected from the group consisting of a semiconductor material incorporating ions from groups 12 and 15 of the periodic table (a 'II-V' semiconductor material), a semiconductor material incorporating ions from groups 14 and 16 of the periodic table (a 'IV-VI' semiconductor material) and a semiconductor material incorporating ions from groups 11, 13 and 16 of the periodic table (a 'I-III-VI' semiconductor material), any other core, first or second layers in a particular nanoparticle may comprise a II-V, IV-VI or I-II-VI material. For example, where a nanoparticle in accordance with the present invention has a core comprising a II-V semiconductor material, the nanoparticle may possess a first layer comprising any appropriate semiconductor material for example a different II-V material (i.e. a II-V material in which the II ions are ions of a different element of group 12 compared to the II ions in the core material and/or the V ions are ions of a different element compared to the group 15 ions in the core material), or a IV-VI or I-III-VI semiconductor material. Furthermore, if the nanoparticle in accordance with the present invention possess a second layer comprising a I-III-VI semiconductor material, it may possess a first layer comprising any suitable semiconductor material including a different I-III-VI semiconductor material, or a II-V or IV-VI material. It will be appreciated that when choosing suitable semiconductor materials to place next to one another in a particular nanoparticle (e.g. when choosing a suitable first layer material for deposition on a core, or a suitable second layer material for deposition on a first layer) consideration should be given to matching the crystal phase and lattice constants of the materials as closely as possible.

The method forming the first aspect of the present invention may be used to produce a nanoparticle comprised of a core comprising a core semiconductor material, a first layer comprising a first semiconductor material provided on said core and a second layer comprising a second semiconductor material provided on said first layer, said core semiconductor material being different to said first semiconductor material and said first semiconductor material being different to said second semiconductor material, wherein a) at least two of the core, first shell and second shell materials incorporate ions from groups 12 and 15 of the periodic table, groups 14 and 16 of the periodic table, or groups 11, 13 and 16 of the periodic table;

b) the second shell material incorporates ions of at least two different elements from group 12 of the periodic table and ions from group 16 of the periodic table;

c) at least one of the core, first and second semiconductor materials incorporates ions from groups 11, 13 and 16 of the periodic table and at least one other of the core, first and second semiconductor materials is a semiconductor material not incorporating ions from groups 11, 13 and 16 of the periodic table.

Preferably in set a) the other of the core, first and second semiconductor materials incorporates ions from the group consisting groups 12 and 15 of the periodic table, groups 13 and 15 of the periodic table, groups 12 and 16 of the periodic table, groups 14 and 16 of the periodic table, and groups 11, 13 and 16 of the periodic table.

It is preferred that in set b) said second semiconductor material has the formula $M_xN_{1-x}E$, where M and N are the group 12 ions, E is the group 16 ion, and $0<x<1$. It is preferred that $0.1<x<0.9$, more preferably $0.2<x<0.8$, and most preferably $0.4<x<0.6$. Particularly preferred nanoparticles have the structure ZnS/CdSe/$Cd_xZn_{1-x}S$/$Cd_xZn_{1-x}S$/CdSe/ZnS or $Cd_xZn_{1-x}S$/CdSe/$Cd_xZn_{1-x}S$.

In a preferred embodiment of set c) said at least one other of the core, first and second semiconductor materials not incorporating ions from groups 11, 13 and 16 of the periodic table incorporates ions from the group consisting of groups 12 and 15 of the periodic table, groups 13 and 15 of the periodic table, groups 12 and 16 of the periodic table, and groups 14 and 16 of the periodic table.

Preferably the nanoparticle formed using the method according to the first aspect of the present invention further comprises a third layer of a third semiconductor material provided on said second layer. The nanoparticle may optionally comprise still further layers of semiconductor material, such as fourth, fifth, and sixth layers.

It is preferred that the third semiconductor material is selected from the group consisting of a semiconductor material incorporating ions from groups 12 and 15 of the periodic table, a semiconductor material incorporating ions from groups 13 and 15 of the periodic table, a semiconductor material incorporating ions from groups 12 and 16 of the periodic table, a semiconductor material incorporating ions from groups 14 and 16 of the periodic table and a semiconductor material incorporating ions from groups 11, 13 and 16 of the periodic table.

Preferably the group 12 ions are selected from the group consisting of zinc ions, cadmium ions and mercury ions. The group 15 ions are preferably selected from the group consisting of nitride ions, phosphide ions, arsenide ions, and antimonide ions. It is preferred that the group 14 ions are selected from the group consisting of lead ions, tin ions and germanium ions. Preferably the group 16 ions are selected from the group consisting of sulfide ions, selenide ions and telluride ions. The group 11 ions are preferably selected from the group consisting of copper ions, silver ions and gold ions. In a preferred embodiment the group 13 ions are selected from the group consisting of aluminium ions, indium ions and gallium ions.

The core, first and second semiconductor materials may include ions in an approximate 1:1 ratio (i.e. having a stoichiometry of 1:1). For example, the nanoparticle ZnS/CdTe/ZnS contains a first layer of CdTe in which the ratio of cadmium to telluride ions is approximately 1:1. The semiconductor materials may possess different stroichiometries, for example the nanoparticle ZnS/$CuInS_2$/ZnS contains a first layer of $CuInS_2$ in which the ratio of copper to indium ions is approximately 1:1 but the ratio of copper to sulfide ions is 1:2 and the ratio of indium to sulfide ions is 1:2. Moreover, the semiconductor materials may possess non-empirical stoichiometries. For example, the nanoparticle ZnS/$CuInS_2$/$Cd_xZn_{1-x}S$ incorporates a second layer of $Cd_xZn_{1-x}S$ where $0<x<1$. The notation $M_xN_{1-x}E$ is used herein to denote a mixture of ions M, N and E (e.g. M=Cd, N=Zn, E=S) contained in a semiconductor material. Where the notation $M_xN_{1-x}E$ is used it is preferred that $0<x<1$, preferably $0.1<x<0.9$, more preferably $0.2<x<0.8$, and most preferably $0.4<x<0.6$.

The temperature of the dispersing medium containing the growing nanoparticles may be increased at any appropriate rate depending upon the nature of the nanoparticle core precursor composition and the molecular cluster compound being used. Preferably the temperature of the dispersing medium is increased at a rate in the range 0.05° C./min to 1° C./min, more preferably at a rate in the range 0.1° C./min to 1° C./min, and most preferably the temperature of the dispersing medium containing the growing nanoparticles is increased at a rate of approximately 0.2° C./min.

Any suitable molar ratio of the molecular cluster compound to first and second nanoparticle core precursors may be used depending upon the structure, size and composition of the nanoparticles being formed, as well as the nature and concentration of the other reagents, such as the nanoparticle core precursor(s), capping agent, size-directing compound and solvent. It has been found that particularly useful ratios of the number of moles of cluster compound compared to the total number of moles of the first and second precursor species preferably lie in the range 0.0001-0.1 (no. moles of cluster compound):1 (total no. moles of first and second precursor species), more preferably 0.001-0.1:1, yet more preferably 0.001-0.060:1. Further preferred ratios of the number of moles of cluster compound compared to the total number of moles of the first and second precursor species lie in the range 0.002-0.030:1, and more preferably 0.003-0.020:1. In particular, it is preferred that the ratio of the number of moles of cluster compound compared to the total number of moles of the first and second precursor species lies in the range 0.0035-0.0045:1.

It is envisaged that any suitable molar ratio of the first precursor species compared to the second precursor species may be used. For example, the molar ratio of the first precursor species compared to the second precursor species may lie in the range 100-1 (first precursor species): 1 (second precursor species), more preferably 50-1:1. Further preferred ranges of the molar ratio of the first precursor species compared to the second precursor species lie in the range 40-5:1, more preferably 30-10:1. In certain applications it is preferred that approximately equal molar amounts of the first and second precursor species are used in the method of the invention. The molar ratio of the first precursor species compared to the second precursor species preferably lies in the range 0.1-1.2: 1, more preferably, 0.9-1.1:1, and most preferably 1:1. In other applications, it may be appropriate to use approximately twice the number of moles of one precursor species compared to the other precursor species. Thus the molar ratio of the first precursor species compared to the second precursor species may lie in the range 0.4-0.6:1, more preferably the molar ratio of the first precursor species compared to the second precursor species is 0.5:1. It is to be understood that the above precursor molar ratios may be reversed such that they relate to the molar ratio of the second precursor species compared to the first precursor species. Accordingly, the molar ratio of the second precursor species compared to the first precursor species may lie in the range 100-1 (second precursor species): 1 (first precursor species), more preferably 50-1:1, 40-5:1, or 30-10:1. Furthermore, the molar ratio of the second precursor species compared to the first precursor species may lie in the range 0.1-1.2:1, 0.9-1.1:1, 0.4-0.6:1, or may be 0.5:1.

In a preferred embodiment of the first aspect of the present invention the molecular cluster compound and core precursor composition are dispersed in a suitable dispersing medium at a first temperature and the temperature of the dispersing medium containing the cluster compound and core precursor composition is then increased to a second temperature which is sufficient to initiate seeding and growth of the nanoparticle cores on the molecular clusters of said compound.

Preferably the first temperature is in the range 50° C. to 100° C., more preferably in the range 70° C. to 80° C., and most preferably the first temperature is approximately 75° C.

The second temperature may be in the range 120° C. to 280° C. More preferably the second temperature is in the range 150° C. to 250° C., and most preferably the second temperature is approximately 200° C.

The temperature of the dispersing medium containing the cluster compound and core precursor composition may be increased from the first temperature to the second temperature over a time period of up to 48 hours, more preferably up to 24 hours, yet more preferably 1 hour to 24 hours, and most preferably over a time period in the range 1 hour to 8 hours.

In a further preferred embodiment of the first aspect of the present invention the method comprises a. dispersing the molecular cluster compound and an initial portion of the nanoparticle core precursor composition which is less than the total amount of the nanoparticle core precursor composition to be used to produce said nanoparticle cores in a suitable dispersing medium at a first temperature;

b. increasing the temperature of the dispersing medium containing the cluster compound and core precursor composition to a second temperature which is sufficient to initiate seeding and growth of the nanoparticle cores on the molecular clusters of said molecular cluster compound; and c. adding one or more further portions of the nanoparticle core precursor composition to the dispersing medium containing the growing nanoparticle cores, wherein the temperature of the dispersing medium containing the growing nanoparticle cores is increased before, during and/or after the addition of the or each further portion of the nanoparticle core precursor composition.

In this preferred embodiment less than the total amount of precursor to be used to produce the nanoparticle cores is present in the dispersing medium with the cluster compound prior to the initiation of nanoparticle growth and then as the reaction proceeds and the temperature is increased, additional amounts of core precursors are periodically added to the reaction mixture in the dispersing medium. Preferably the additional core precursors are added either dropwise as a solution or as a solid.

The temperature of the dispersing medium containing the growing nanoparticle cores may be increased at any appropriate rate depending upon the nature of the nanoparticle core precursor composition and the molecular cluster compound being used. Preferably the temperature of the dispersing medium is increased at a rate in the range 0.05° C./min to 1° C./min, more preferably at a rate in the range 0.1° C./min to 1° C./min, and most preferably the temperature of the dispersing medium containing the growing nanoparticle cores is increased at a rate of approximately 0.2° C./min.

While the first and second temperatures of the dispersing medium may take any suitable value, in a preferred embodiment of the present invention said first temperature is in the range 15° C. to 60° C. Said second temperature may be in the range 90° C. to 150° C.

It is preferred that the or each further portion of the nanoparticle core precursor composition is added dropwise to the dispersing medium containing the growing nanoparticle cores.

The or each further portion of the nanoparticle core precursor composition may be added to the dispersing medium containing the growing nanoparticle cores at any desirable rate. It is preferred that the core precursor composition is added to the dispersing medium at a rate in the range 0.1 ml/min to 20 ml/min per litre of dispersing medium, more preferably at a rate in the range 1 ml/min to 15 ml/min per litre of dispersing medium, and most preferably at a rate of around 5 ml/min per litre of dispersing medium.

Preferably said initial portion of the nanoparticle core precursor composition is less than or equal to approximately 90% of the total amount of the nanoparticle core precursor composition to be used to produce said nanoparticle cores. Said initial portion of the nanoparticle core precursor composition may be less than or equal to approximately 10% of the total amount of the nanoparticle core precursor composition to be used to produce said nanoparticle cores.

In a preferred embodiment where one further portion of the nanoparticle core precursor composition is added to the dispersing medium containing the growing nanoparticle cores said one further portion is less than or equal to approximately 90% of the total amount of the nanoparticle core precursor composition to be used to produce said nanoparticle cores.

In a further preferred embodiment where more than one further portion of the nanoparticle core precursor composition is added to the dispersing medium containing the growing nanoparticle cores, each of said further portions is less than or equal to approximately 45% of the total amount of the nanoparticle core precursor composition to be used to produce said nanoparticle cores. Each of said further portions may be less than or equal to approximately 10% of the total amount of the nanoparticle core precursor composition to be used to produce said nanoparticle cores.

It is preferred that formation of said molecular cluster compound is effected in situ in said dispersing medium prior to dispersing the molecular cluster compound and the initial portion of the nanoparticle core precursor composition in said dispersing medium.

In a preferred embodiment of the present invention said process is subject to the proviso that the nanoparticle core precursor composition does not contain $Cd(CH_3CO_2)_2$. A further preferred embodiment provides that said process is subject to the proviso that the nanoparticle core precursor composition does not contain TOPSe. Said process may be subject to the proviso that the nanoparticle core precursor composition does not contain $Cd(CH_3CO_2)_2$ and TOPSe. In a still further preferred embodiment said process is subject to the proviso that the temperature of the dispersing medium containing the growing nanoparticle cores is increased at a rate which is other than 50° C. over a period of 24 hours.

The conversion of the core precursor to the material of the nanoparticles can be conducted in any suitable dispersing medium or solvent. In the method of the present invention it is important to maintain the integrity of the molecules of the cluster compound. Consequently, when the cluster compound and nanoparticle core precursor are introduced in to the dispersing medium or solvent the temperature of the medium/solvent must be sufficiently high to ensure satisfactory dissolution and mixing of the cluster compound it is not necessary that the present compounds are fully dissolved but desirable. It is most preferred that the temperature of the dispersing medium containing the cluster and precursors should not be so high as to disrupt the integrity of the cluster compound molecules. Once the cluster compound and core precursor composition are sufficiently well dissolved in the solvent the temperature of the solution thus formed is raised to a temperature, or range of temperatures, which is/are sufficiently high to initiate nanoparticle core growth but not so high as to damage the integrity of the cluster compound molecules. As the temperature is increased further quantities of core precursor are added to the reaction, preferably in a dropwise manner or as a solid. The temperature of the solution can then be maintained at this temperature or within this temperature range for as long as required to form nanoparticle cores possessing the desired properties.

A wide range of appropriate dispersing media/solvents are available. The particular dispersing medium used is usually at least partly dependent upon the nature of the reacting species, i.e. nanoparticle core precursor and/or cluster compound, and/or the type of nanoparticles which are to be formed. Preferred dispersing media include Lewis base type coordinating solvents, such as a phosphine (e.g. TOP), a phosphine oxide (e.g. TOPO) or an amine (e.g. HDA), or non-coordinating organic solvents, e.g. alkanes and alkenes (e.g. octadecene). If a non-coordinating solvent is used then it will usually be used in the presence of a further coordinating agent to act as a capping agent for the following reason.

If the nanoparticles being formed are intended to function as quantum dots it is important that the surface atoms which are not fully coordinated "dangling bonds" are capped to minimise non-radiative electron-hole recombinations and inhibit particle agglomeration which can lower quantum efficiencies or form aggregates of nanoparticles. A number of different coordinating solvents are known which can also act as capping or passivating agents, e.g. TOP, TOPO, HDA or long chain organic acids such as myristic acid. If a solvent is chosen which cannot act as a capping agent then any desirable capping agent can be added to the reaction mixture during nanoparticle growth. Such capping agents are typically Lewis bases but a wide range of other agents are available, such as oleic acid and organic polymers which form protective sheaths around the nanoparticles.

The first aspect of the present invention comprises of a method to produce nanoparticle materials using molecular clusters, whereby the clusters are defined identical molecular entities, as compared to ensembles of small nanoparticles, which inherently lack the anonymous nature of molecular clusters. The invention consists of the use of molecular clusters as templates to seed the growth of nanoparticle cores, whereby other molecular sources, i.e. the precursor compounds, or "molecular feedstocks" are consumed to facilitate particle growth. The molecular sources (i.e. core precursor composition) are periodically added to the reaction solution so as to keep the concentration of free ions to a minimum but also maintain a concentration of free ions to inhibit Oswards ripening from occurring and defocusing of nanoparticle size range from occurring.

A further preferred embodiment of the first aspect of the present invention provides that the method comprises:

i. monitoring the average size of the nanoparticle cores being grown; and ii. terminating nanoparticle core growth when the average nanoparticle size reaches a predetermined value.

It is preferred that the average size of the nanoparticle cores being grown is monitored by UV-visible absorption spectroscopy. The average size of the nanoparticle cores being grown may be monitored by photoluminescence spectroscopy. Preferably nanoparticle core growth is terminated by reducing the temperature of the dispersing medium from the second temperature to a third temperature.

Conveniently the method may comprise forming a precipitate of the nanoparticle core material by the addition of a precipitating reagent, which is preferably selected from the group consisting of ethanol and acetone.

Preferably conversion of the core precursor composition to the nanoparticle core is effected in a reaction medium and said nanoparticle core is isolated from said reaction medium prior to deposition of the first layer.

It is preferable that deposition of said first layer comprises effecting conversion of a first semiconductor material precursor composition to said first semiconductor material. The first semiconductor material precursor composition preferably comprises third and fourth precursor species containing the ions to be incorporated into the growing first layer of the nanoparticle. The third and fourth precursor species may be separate entities contained in said first semiconductor material precursor composition, or the third and fourth precursor species may be combined in a single entity contained in the first semiconductor material precursor composition.

Preferably deposition of said second layer comprises effecting conversion of a second semiconductor material precursor composition to said second semiconductor material. The second semiconductor material precursor composition preferably comprises fifth and sixth precursor species containing the ions to be incorporated into the growing second layer of the nanoparticle. It is preferred that the fifth and sixth precursor species are separate entities contained in said second semiconductor material precursor composition, alternatively the fifth and sixth precursor species may be combined in a single entity contained in said second semiconductor material precursor composition.

A second aspect of the present invention provides a nanoparticle produced according to a method in accordance with the first aspect of the present invention.

A third aspect of the present invention provides a nanoparticle comprised of a core comprising a core semiconductor material, a first layer comprising a first semiconductor material provided on said core and a second layer comprising a second semiconductor material provided on said first layer, said core semiconductor material being different to said first semiconductor material and said first semiconductor material being different to said second semiconductor material, wherein a) at least two of the core, first shell and second shell materials incorporate ions from groups 12 and 15 of the periodic table, groups 14 and 16 of the periodic table, or groups 11, 13 and 16 of the periodic table;

b) the second shell material incorporates ions of at least two different elements from group 12 of the periodic table and ions from group 16 of the periodic table;

c) at least one of the core, first and second semiconductor materials incorporates ions from groups 11, 13 and 16 of the periodic table and at least one other of the core, first and second semiconductor materials is a semiconductor material not incorporating ions from groups 11, 13 and 16 of the periodic table.

Preferably in set a) the other of the core, first and second semiconductor materials incorporates ions from the group consisting groups 12 and 15 of the periodic table, groups 13 and 15 of the periodic table, groups 12 and 16 of the periodic table, groups 14 and 16 of the periodic table, and groups 11, 13 and 16 of the periodic table.

It is preferred that in set b) said second semiconductor material has the formula $M_xN_{1-x}E$, where M and N are the group 12 ions, E is the group 16 ion, and $0<x<1$. It is preferred that $0.1<x<0.9$, more preferably $0.2<x<0.8$, and most preferably $0.4<x<0.6$. Particularly preferred nanoparticles have the structure $ZnS/CdSe/Cd_xZn_{1-x}S$, $Cd_xZn_{1-x}S/CdSe/ZnS$ or $Cd_xZn_{1-x}S/CdSe/Cd_xZn_{1-x}S$.

In a preferred embodiment of set c) said at least one other of the core, first and second semiconductor materials not incorporating ions from groups 11, 13 and 16 of the periodic table incorporates ions from the group consisting of groups 12 and 15 of the periodic table, groups 13 and 15 of the periodic table, groups 12 and 16 of the periodic table, and groups 14 and 16 of the periodic table.

Preferably the nanoparticle further comprises a third layer of a third semiconductor material provided on said second layer. The nanoparticle may optionally comprise still further layers of semiconductor material, such as fourth, fifth, and sixth layers.

Regarding the third aspect of the present invention it is preferred that the third semiconductor material is selected from the group consisting of a semiconductor material incorporating ions from groups 12 and 15 of the periodic table, a semiconductor material incorporating ions from groups 13 and 15 of the periodic table, a semiconductor material incorporating ions from groups 12 and 16 of the periodic table, a semiconductor material incorporating ions from groups 14 and 16 of the periodic table and a semiconductor material incorporating ions from groups 11, 13 and 16 of the periodic table.

Preferably the group 12 ions are selected from the group consisting of zinc ions, cadmium ions and mercury ions.

The group 15 ions are preferably selected from the group consisting of nitride ions, phosphide ions, arsenide ions, and antimonide ions.

It is preferred that the group 14 ions are selected from the group consisting of lead ions, tin ions and germanium ions.

Preferably the group 16 ions are selected from the group consisting of sulfide ions, selenide ions and telluride ions.

The group 11 ions are preferably selected from the group consisting of copper ions, silver ions and gold ions.

In a preferred embodiment the group 13 ions are selected from the group consisting of aluminium ions, indium ions and gallium ions.

The current invention describes the design and preparation methods of a number of unique quantum dot-quantum wells nanoparticles including, $ZnS/CuInS_2/ZnS$, $ZnS/CuInS_2/Cd_xZn_{1-x}S$, $Cd_xZn_{1-x}S/CuInS_2/Cd_xZn_{1-x}S$, $ZnS/CuGaS_2/ZnS$, $ZnS/CuGaS_2/Cd_xZn_{1-x}S$, $Cd_xZn_{1-x}S/CuGaS_2/Cd_xZn_{1-x}S$, $ZnS/CuInSe_2/ZnS$, $ZnS/CuInSe_2/Cd_xZn_{1-x}S$, $Cd_xZn_{1-x}S/CuInSe_2/Cd_xZn_{1-x}S$ $ZnS/CuGaSe_2/ZnS$, $ZnS/CuGaSe_2/Cd_xZn_{1-x}S$ and $Cd_xZn_{1-x}S/CuGaSe_2/Cd_xZn_{1-x}S$, where $0<x<1$.

A fourth aspect of the present invention provides a method for producing a nanoparticle according to the third aspect of the present invention, wherein the method comprises effecting conversion of a nanoparticle core precursor composition to the material of the nanoparticle core, depositing said first layer on said core and depositing said second layer on said first layer.

It will be evident to the skilled person how the method forming the fourth aspect of the present invention may be put in to effect by routine modification to the experimental details disclosed herein and involving no undue experimentation for the preparation of core/multishell nanoparticles in accordance with the third aspect of the present invention.

Preferably said nanoparticle core precursor composition comprises first and second core precursor species containing the ions to be incorporated into the growing nanoparticle core. It is preferred that the first and second core precursor species are separate entities contained in the core precursor composition, and the conversion is effected in the presence of a molecular cluster compound under conditions permitting seeding and growth of the nanoparticle core.

The first and second core precursor species may be combined in a single entity contained in the core precursor composition.

Preferably conversion of the core precursor composition to the nanoparticle core is effected in a reaction medium and said nanoparticle core is isolated from said reaction medium prior to deposition of the first layer.

In a preferred embodiment of the fourth aspect of the present invention deposition of the first layer comprises effecting conversion of a first semiconductor material precursor composition to said first semiconductor material.

Preferably the first semiconductor material precursor composition comprises third and fourth precursor species containing the ions to be incorporated into the growing first layer of the nanoparticle. The third and fourth precursor species may be separate entities contained in the first semiconductor material precursor composition (i.e. the precursor species may be provided by a 'multi source' or 'dual source' precursor composition). Alternatively or additionally the third and fourth precursor species may be combined in a single entity contained in the first semiconductor material precursor composition (i.e. the precursor composition may contain a 'single source' precursor comprising both the third and fourth ions to be incorporated in to the first layer).

Preferably deposition of the second layer comprises effecting conversion of a second semiconductor material precursor composition to said second semiconductor material.

Preferably the second semiconductor material precursor composition comprises fifth and sixth precursor species containing the ions to be incorporated into the growing second layer of the nanoparticle. The fifth and sixth precursor species may be separate entities contained in said second semiconductor material precursor composition, and/or the fifth and sixth precursor species may be combined in a single entity contained in said second semiconductor material precursor composition.

The invention addresses a number of problems, which include the difficulty of producing high efficiency blue emitting dots.

The most researched and hence best-characterized semiconductor QD is CdSe, whose optical emission can be tuned across the visible region of the spectrum. Green and red CdSe/ZnS core-shell nanocrystals are the most widely available under existing methodologies. CdSe nanoparticles with blue emission along with narrow spectral widths and high luminescence quantum yields are difficult to synthesize using the conventional high temperature rapid injection "nucleation and growth" method. Using this conventional method to make blue quantum dots is difficult as the blue quantum dots are the smallest and are what is initially formed but rapidly grow (about 3 seconds of reaction time) in to larger does which have a green emission. There are also further problems including difficulties in experimental work-up, processes and overcoating with ZnS. Moreover, only small quantities of material can be produced in a single batch due to the dilute reaction solution necessary to keep the particle size small. Alternative blue emitting semiconductor nanocrystals include ZnTe and CdS, however, growing large (>4.5 nm diameter) ZnTe, needed for blue emissions, with narrow size distributions has proved difficult.

CdS on the other hand has an appropriate band gap and has been shown to emit in the 460-480 nm range with narrow size distributions and good luminescence efficiency. Bare CdS cores tend to emit white luminescence, attributed to deep trap emissions which can be suppressed by overcoating by a wide band gap material such as ZnS. These CdS/ZnS structures have shown recent promise as the active material for blue QD LED's and blue QD lasers.

Quantum Dots Incorporating Lower Toxicity Elements

Another drive for designing and producing specific quantum dot-quantum well structures in this invention is the current need for quantum dots free of elements (e.g. cadmium and mercury) which are deemed by national authorities to be toxic or potentially toxic but which have similar optical and/or electronic properties to those of CdSe—ZnS core-shell quantum dots. The current invention includes the design and synthesis of a number of cadmium free QD-QW structures based on II-VI/I-III-VI$_2$/II-VI, III-V/II-V/III-V materials such as but not restricted to ZnS/CuInS$_2$/ZnS, ZnS/CuGaS$_2$/ZnS, ZnS/CuInSe$_2$/ZnS, ZnS/CuGaSe$_2$/ZnS.[9,10,11,12]

Current Synthetic Methods

Many synthetic methods for the preparation of semiconductor nanoparticles have been reported, early routes applied conventional colloidal aqueous chemistry, with more recent methods involving the kinetically controlled precipitation of nanocrystallites, using organometallic compounds.

Over the past six years the important issues have concerned the synthesis of high quality semiconductor nanoparticles in terms of uniform shape, size distribution and quantum efficiencies. This has lead to a number of methods that can routinely produce semiconductor nanoparticles, with monodispersity of <5% with quantum yields >50%. Most of these methods are based on the original "nucleation and growth" method described by Murray, Norris and Bawendi, using organometallic precursors. Murray et al originally used organometallic solutions of metal-alkyls (R$_2$M) M=Cd, Zn, Te; R=Me, Et and tri-n-octylphosphine sulfide/selenide (TOPS/Se) dissolved in tri-n-octylphosphine (TOP). These precursor solutions are injected into hot tri-n-octylphosphine oxide (TOPO) in the temperature range 120-400° C. depending on the size of the particles required and the material being produced. This produces TOPO coated/capped semiconductor nanoparticles of II-VI material. The size of the particles is controlled by the temperature, concentration of precursor used and length of time at which the synthesis is undertaken, with larger particles being obtained at higher temperatures, higher precursor concentrations and prolonged reaction times.

This organometallic route has advantages over other synthetic methods, including near monodispersity <5% and high particle cystallinity. As mentioned, many variations of this method have now appeared in the literature which routinely give high quality core and core-shell nanoparticles with monodispersity of <5% and quantum yield >50% (for core-shell particles of as-prepared solutions), with many methods displaying a high degree of size and shape control.[1,2]

Recently attention has focused on the use of "greener"[†] precursors which are less exotic and less expensive but not necessary more environmentally friendly. Some of these new precursors include the oxides, CdO; carbonates MCO$_3$ M=Cd, Zn; acetates M(CH$_3$CO$_2$) M=Cd, Zn and acetylacetanates [CH$_3$COOCH=C(O$^-$)CH$_3$]$_2$ M=Cd, Zn; amongst other.

[†](The use of the term "greener" precursors in semiconductor particle synthesis has generally taken on the meaning of cheaper, readily available and easier to handle precursor starting materials, than the originally used organometallics which are volatile and air and moisture sensitive, and does not necessary mean that "greener precursors" are any more environmentally friendly).

Single-source precursors have also proved useful in the synthesis of semiconductor nanoparticle materials of II-VI, as well as other compound semiconductor nanoparticles. Bis(dialkyldithio-/diseleno-carbamato)cadmium(II)/zinc(II) compounds, M(E$_2$CNR$_2$)$_2$ (M=Zn or Cd, E=S or Se and R=alkyl), have used a similar 'one-pot' synthetic procedure, which involved dissolving the precursor in tri-ii-octylphosphine (TOP) followed by rapid injection into hot tri-n-octylphosphine oxide/tri-n-octylphosphine (TOPO/TOP) above 200° C. Single-source precursors have also been used to produce I-III-VI$_2$ materials i.e. CuInS$_2$ using (PPH$_3$)$_2$CuIn(SEt)$_4$ dissolved in a mixture of hexanethiol and dioctylphalate at 200° C. to give hexanethiol coated CuInS$_2$.[3]

I-III-VI$_2$ nanoparticles have also been prepared from multi-source precursors such as in the case of CuInSe$_2$ prepared from CuCl dissolved in triethylene and elemental indium and selenium. CuInTe$_2$ was produce by a similar approach but from using elemental tellurium.

For all the above methods, rapid particle nucleation followed by slow particle growth is essential for a narrow particle size distribution. All these synthetic methods are based on the original organometallic "nucleation and growth" method by Murray et al, which involves the rapid injection of the precursors into a hot solution of a Lewis base coordinating solvent (capping agent) which may also contain one of the precursors. The addition of the cooler solution subsequently lowers the reaction temperature and assist particle growth but inhibits further nucleation. The temperature is then maintained for a period of time, with the size of the resulting particles depending on reaction time, temperature and ratio of capping agent to precursor used. The resulting solution is cooled followed by the addition of an excess of a polar solvent (methanol or ethanol or sometimes acetone) to produce a precipitate of the particles that can be isolated by filtration or centrifugation.

Preparation from single-source molecular clusters, Cooney and co-workers used the cluster [S$_4$Cd$_{10}$(SPh)$_{16}$][Me$_3$NH]$_4$ to produce nanoparticles of CdS via the oxidation of surface-capping SPh$^-$ ligands by iodine. This route followed the fragmentation of the majority of clusters into ions which were consumed by the remaining Another method whereby it is possible to produce large volumes of quantum dots, eliminated the need for a high temperature nucleation step. Moreover, conversion of the precursor composition to the nanoparticles is affected in the presence of a molecular cluster compound. Each identical molecule of a cluster compound acts as a seed or nucleation point upon which nanoparticle growth can be initiated. In this way, nanoparticle nucleation is not necessary to initiate nanoparticle growth because suitable nucleation sites are already provided in the system by the molecular clusters. The molecules of the cluster compound act as a template to direct nanoparticle growth. By providing nucleation sites which are so much more well defined than the nucleation sites employed in previous work the nanoparticles formed in this way possess a significantly more well defined final structure than those obtained using previous methods. A significant advantage of this method is that it can be more easily scaled-up for use in industry than conventional methods.[4]

The particular solvent used is usually at least partly dependent upon the nature of the reacting species, i.e. nanoparticle precursor and/or cluster compound, and/or the type of nanoparticles which are to be formed. Typical solvents include Lewis base type coordinating solvents, such as a phosphine (e.g. TOP), a phosphine oxide (e.g. TOPO) or an amine (e.g. HDA), hexanethiol, or non-coordinating organic solvents, e.g. alkanes and alkenes. If a non-coordinating solvent is used then it will usually be used in the presence of a further coordinating agent to act as a capping agent for the following reason.

If the nanoparticles are intended to function as quantum dots an outer capping agent (e.g. an organic layer) must be attached to stop particle agglomeration from occurring. A number of different coordinating solvents are known which can also act as capping or passivating agents, e.g. TOP, TOPO, alkylthiols or HDA. If a solvent is chosen which cannot act as a capping agent then any desirable capping agent can be added to the reaction mixture during nanoparticle growth. Such capping agents are typically Lewis bases but a wide range of other agents are available, such as oleic acid and organic polymers which form protective sheaths around the nanoparticles.

DESCRIPTION OF INVENTION

Type of System Covered by the Current Invention

The present invention is directed to the preparation of a number of semiconductor nanoparticles which may be considered as falling within the class of materials known as quantum dot-quantum wells and includes materials within the size range 2-100 nm. The present invention describes the architecture and the preparation of a number of nanoparticles materials and includes a number of compound semiconductor particles otherwise referred to as quantum dots-quantum well, include material comprising of $ZnS/CuInS_2/ZnS$, $ZnS/CuInS_2/Cd_xZn_{1-x}S$, $Cd:ZnS/CuInS_2/Cd_xZn_{1-x}S$, $ZnS/CuGaS_2/ZnS$, $ZnS/CuGaS_2/Cd_xZn_{1-x}S$, $Cd_xZn_{1-x}S/CuGaS_2/Cd_xZn_{1-x}S$, $ZnS/CuInSe_2/ZnS$, $ZnS/CuInSe_2/Cd_xZn_{1-x}S$, $Cd_xZn_{1-x}S/CuInSe_2/Cd_xZn_{1-x}S$, $ZnS/CuGaSe_2/ZnS$, $ZnS/CuGaSe_2/Cd_xZn_{1-x}S$ and $Cd_xZn_{1-x}S/CuGaSe_2/Cd_xZn_{1-x}S$, where $0<x<1$.

II-VI/II-VI/II-VI Material

Comprising a core of a first element from group 12 of the periodic table and a second element from group 16 of the periodic table, a first layer of material comprising a shell of a first element from group 12 of the periodic table and a second element from group 16 of the periodic table and a second layer material comprising a shell of a first element from group 12 of the periodic table and a second element from group 16 of the periodic table and also including ternary and quaternary materials and doped materials. Nanoparticle materials include but are not restricted to: —ZnS/CdSe/CdS/ZnS, ZnS/CdTe/ZnS, ZnS/CdHgS/ZnS, ZnS/HgSe/ZnS, ZnS/HgTe/ZnS, ZnSe/CdSe/ZnSe, ZnSe/CdTe/ZnSe, ZnSe/HgS/ZnSe, ZnS/HgSe/ZnS, ZnSe/HgTe/ZnSe, ZnTe/CdSe/ZnS, ZnTe/CdTe/ZnS, ZnTe/CdHgS/ZnS, ZnTe/HgSe/ZnS, ZnTe/HgTe/ZnS, CdS/CdSe/ZnS, CdS/CdTe/ZnS, CdS/CdHgS/ZnS, CdS/HgSe/ZnS, CdS/HgTe/ZnS, CdSe/CdTe/ZnS, CdSe/CdHgS/ZnS, CdSe/HgSe/ZnS, CdSe/HgTe/ZnS, CdTe/CdSe/ZnS, CdTe/CdHgS/ZnS, CdTe/HgSe/ZnS, CdTe/HgTe/ZnS, HgS/CdSe/ZnS, HgS/CdTe/ZnS, HgS/CdHgS/ZnS, HgS/HgSe/ZnS, HgS/HgTe/ZnS, HgSe/CdSe/ZnS, HgSe/CdTe/ZnS, HgSe/CdHgS/ZnS, HgSe/HgTe/ZnS.

II-VI/I-III-VI$_2$/II-VI Material

Comprising a core of a first element from group 12 of the periodic table and a second element from group 16 of the periodic table, a first layer of material comprising of a shell of a first element from group 11 of the periodic table and a second element from group 13 of the periodic table a third element from group 16 of the periodic table and a second layer material comprising a shell of a first element from group 12 of the periodic table and a second element from group 16 of the periodic table and also including ternary and quaternary materials and doped materials. Nanoparticle materials include but are not restricted to:

$ZnS/CuInS_2/ZnS$, $ZnS/CuInS_2/CdS/ZnS$, $CdS/ZnS/CuInS_2/CdS/ZnS$, $ZnS/CuGaS_2/ZnS$, $ZnS/CuGaS_2/CdS/ZnS$, $CdS/ZnS/CuGaS_2/CdS/ZnS$, $ZnS/CuInSe_2/ZnS$, $ZnS/CuInSe_2/CdS/ZnS$, $CdS/ZnS/CuInSe_2/CdS/ZnS$, $ZnS/CuGaSe_2/ZnS$, $ZnS/CuGaSe_2/CdS/ZnS$, $CdS/ZnS/CuGaSe_2/CdS/ZnS$.

II-V/II-V/II-V Material

Comprising a core first element from group 12 of the periodic table and a second element from group 15 of the periodic table, a first layer comprising a first element from group 12 of the periodic table and a second element from group 15 of the periodic table and a second layer of semiconductor material comprising a first element from group 12 of the periodic table and a second element from group 15 of the periodic table and also including ternary and quaternary materials and doped materials. Nanoparticle material includes but is not restricted to:—

$Zn_3P_2/Zn_3As_2/Zn_3P_2$, $Zn_3P_2/Cd_3P_2/Zn_3P_2$, $Zn_3P_2/Cd_3As_2/Zn_3P_2$, $Zn_3P_2/Cd_3N_2/Zn_3P_2$, $Zn_3P_2/Zn_3N_2/Zn_3P_2$, $Zn_3As_2/Zn_3P_2/Zn_3As_2$, $Zn_3As_2/Cd_3P_2/Zn_3As_2$, $Zn_3As_2/Cd_3As_2/Zn_3As_2$, $Zn_3As_2/Cd_3N_2/Zn_3As_2$, $Zn_3As_2/Zn_3N_2/Zn_3As_2$, $Cd_3P_2/Zn_3P_2/Cd_3P_2$, $Cd_3P_2/Zn_3As_2/Cd_3P_2$, $Cd_3P_2/Cd_3As_2/Cd_3P_2$, $Cd_3P_2/Cd_3N_2/Cd_3P_2$, $Cd_3P_2/Zn_3N_2/Cd_3P_2$, $Cd_3As_2/Zn_3P_2/Cd_3As_2$, $Cd_3As_2/Zn_3As_2/Cd_3As_2$, $Cd_3As_2/Cd_3P_2/Cd_3As_2$, $Cd_3As_2/Cd_3N_2/Cd_3As_2$, $Cd_3As_2/Zn_3N_2/Cd_3As_2$, $Cd_3N_2/Zn_3P_2/Cd_3N_2$, $Cd_3N_2/Zn_3As_2/Cd_3N_2$, $Cd_3N_2/Cd_3P_2/Cd_3N_2$, $Cd_3N_2/Cd_3As_2/Cd_3N_2$, $Cd_3N_2/Zn_3N_2/Cd_3N_2$, $Zn_3N_2/Zn_3P_2/Zn_3N_2$, $Zn_3N_2/Zn_3As_2/Zn_3N_2$, $Zn_3N_2/Cd_3P_2/Zn_3N_2$, $Zn_3N_2/Cd_3As_2/Zn_3N_2$, $Zn_3N_2/Cd_3N_2/Zn_3N_2$.

III-V/III-V/III-V Material

Comprising a core of a first element from group 13 of the periodic table and a second element from group 15 of the periodic table, a first layer comprising of a first element from group 13 of the periodic table and a second element from group 15 of the periodic table and a second layer comprising of a first element from group 13 of the periodic table and a second element from group 15 of the periodic table and also including ternary and quaternary materials and doped materials. Nanoparticle materials include but are not restricted to:—

AlP/AlAs/AlP, AlP/AlSb/AlP, AlP/GaN/AlP, AlP/GaP/AlP, AlP/GaAs/AlP, AlP/GaSb/AlP, AlP/InN/AlP, AlP/InP/AlP, AlP/InAs/AlP, AlP/InSb/AlP, AlAs/AlP/AlAs, AlP/AlSb/AlP, AlP/GaN/AlP, AlP/GaP/AlP, AlP/GaAs/AlP, AlP/GaSb/AlP, AlP/InN/AlP, AlP/InP/AlP, AlP/InAs/AlP, AlP/InSb/AlP, AlSb/AlP/AlSb, AlSb/AlAs/AlSb, AlSb/GaN/AlSb, AlSb/GaP/AlSb, AlSb/GaAs/AlSb, AlSb/GaSb/AlSb, AlSb/InN/AlSb, AlSb/InP/AlSb, AlSb/InAs/AlSb, AlSb/InSb/AlSb, GaN/AlP/GaN, GaN/AlAs/GaN, GaN/AlAs/GaN, GaN/GaP/GaN, GaN/GaAs/GaN, GaN/GaSb/GaN, GaN/InN/GaN, GaN/InP/GaN, GaN/InAs/GaN, GaN/InSb/GaN, GaP/AlP/GaP, GaP/AlAs/GaP, GaP/AlSb/GaP, GaP/GaN/GaP, GaP/GaAs/GaP, GaP/GaSb/GaP, GaP/InNGaP, GaP/InP/GaP, GaP/InAs/GaP, GaP/InSb/GaP, GaAs/AlP/GaAs, GaAs/AlAs/GaAs, GaAs/AlSb/GaAs, GaAs/GaN/GaAs, GaAs/GaP/GaAs, GaAs/GaSb/GaAs, GaAs/InN/GaAs, GaAs/InP/GaAs, GaAs/InAs/GaAs, GaAs/InSb/GaAs, GaSb/AlP/GaSb, GaSb/AlAs/GaSb, GaSb/AlSb/GaSb, GaSb/GaN/GaSb, GaSb/GaP/GaSb, GaSb/GaAs/GaSb, GaSb/InN/GaSb, GaSb/InP/GaSb, GaSb/InAs/GaSb, GaSb/InSb/GaSb, InN/AlP/InN, InN/AlAs/InN, InN/AlSb/InN, InN/GaN/InN, InN/GaP/InN, InN/GaAs/InN, InN/GaSb/InN, InN/InP/InN, InN/InAs/InN, InN/InSb/InN, InP/AlP/InP, InP/AlAs/InP, InP/AlSb/InP, InP/GaN/InP, InP/GaP/InP, InP/GaAs/InP, InP/GaSb/InP, InP/InN/InP, InP/InAs/InP, InP/InSb/InP, InAs/AlP/InAs, InAs/AlAs/InAs, InAs/AlSb/InAs, InAs/GaN/InAs, InAs/GaP/InAs, InAs/GaAs/InAs, InAs/GaSb/InAs, InAs/InN/InAs, InAs/InP/InAs, InAs/InSb/InAs, InSb/AlP/InSb, InSb/AlAs/InSb, InSb/AlSb/InSb, InSb/GaN/InSb, InSb/GaP/InSb, InSb/GaAs/InSb, InSb/GaSb/InSb, InSb/InN/InSb, InSb/InP/InSb, InSb/InAs/InSb.

IV-VI/IV-VI/IV-VI Material

Comprising a core semiconductor material comprising of a first element from group 14 of the periodic table and a second element from group 16 of the periodic table, a first layer comprising of a first element from group 14 of the periodic table and a second element from group 16 of the periodic table and a second layer comprising of a first element from group 14 of the periodic table and a second element from group 16 of the periodic table and also including ternary and quaternary materials and doped materials. Nanoparticle materials include but are not restricted to:—

PbS/PbSe/PbS, PbS/PbTe/PbS, PbS/Sb$_2$Te$_3$/PbS, PbS/SnS/PbS, PbS/SnSe/PbS, PbS/SnTe/PbS, PbSe/PbS/PbSe, PbSe/PbTe/PbSe, PbSe/Sb$_2$Te$_3$/PbSe, PbSe/SnS/PbSe, PbSe/SnSe/PbSe, PbSe/SnTe/PbSe, PbTe/PbS/PbTe, PbTe/PbSe/PbTe, PbTe/Sb$_2$Te$_3$/PbTe, PbTe/SnS/PbTe, PbTe/SnSe/PbTe, PbTe/SnTe/PbTe, Sb$_2$Te$_3$/PbS/Sb$_2$Te$_3$, Sb$_2$Te$_3$/PbSe/Sb$_2$Te$_3$, Sb$_2$Te$_3$/PbTe/Sb$_2$Te$_3$, Sb$_2$Te$_3$/SnS/Sb$_2$Te$_3$, Sb$_2$Te$_3$/SnSe/Sb$_2$Te$_3$, Sb$_2$Te$_3$/SnTe/Sb$_2$Te$_3$, SnS/PbS/SnS, SnS/PbSe/SnS, SnS/PbTe/SnS, SnS/Sb$_2$Te$_3$/SnS, SnS/SnSe/SnS, SnS/SnTe/SnS, SnSe/PbSe/SnSe, SnSe/PbS/SnSe, SnSe/PbTe/SnSe, SnSe/Sb$_2$Te$_3$/SnSe, SnSe/SnS/SnSe, SnSe/SnTe/SnSe, SnTe/PbS/SnTe, SnTe/PbSe/SnTe, SnTe/PbTe/SnTe, SnTe/Sb$_2$Te$_3$/SnTe, SnTe/SnS/SnTe, SnTe/SnSe/SnTe.

DEFINITIONS RELATING TO THE INVENTION

Semiconductor Nanoparticle

Semiconductor nanoparticles are also known as nanocrystals or quantum dots and generally possess a core surrounded by at least one shell of semiconductor material. Nanoparticles comprising a core and a plurality of shells are known as core/multi-shell nanoparticles. An important class of core/multi-shell nanoparticles are quantum dot-quantum wells which possess an architecture whereby there is a central core of one material overlaid by another material which is further over layered by another material in which adjacent layers comprise different semiconductor materials.

Ternary Phase

By the term ternary phase nanoparticle for the purposes of specifications and claims, refer to nanoparticles of the above but having a core and/or at least one shell layer comprising a three component material. The three components are usually compositions of elements from the as mentioned groups, for example $(Zn_xCd_{(1-x)m}L_n$ nanocrystal (where L is a capping agent and $0<x<1$).

Quaternary Phase

By the term quaternary phase nanoparticle for the purposes of specifications and claims, refer to nanoparticles of the above but having a core or at least one shell comprising a four-component material. The four components are usually compositions of elements from the as mentioned groups, example being $(Zn_xCd_{x-1}S_ySe_{y-1})L$ nanocrystal (where L is a capping agent, $0<x<1$ and $0<y<1$).

Solvothermal

By the term Solvothermal for the purposes of specifications and claims, refer to heating the reaction solution so as to initiate and sustain particle growth or to initiate a chemical reaction between precursors to initiate particle growth and can also take the meaning solvothermal, thermolysis, thermolsolvol, solution-pyrolysis, lyothermal.

Core-Shell and Core/Multi Shell (Quantum Dot-Quantum Well) Particles

The material used on any shell or subsequent numbers of shells grown onto the core particle in most cases will be of a similar lattice type material to the core material i.e. have close lattice match to the core material so that it can be epitaxially grown on to the core, but is not necessarily restricted to materials of this compatibility. The material used on any shell or subsequent numbers of shells grown on to the core present in most cases will have a wider band-gap then the core material but is not necessarily restricted to materials of this compatibility.

Capping Agent

The outer most layer (capping agent) of organic material or sheath material is to inhibit particles aggregation and to protect the nanoparticle from the surrounding chemical environment and to provide a means of chemical linkage to other inorganic, organic or biological material. The capping agent can be the solvent that the nanoparticle preparation is undertaken in, and consists of a Lewis base compound whereby there is a lone pair of electrons that are capable of donor type coordination to the surface of the nanoparticle and can include mono- or multi-dentate ligands of the type but not restricted to:— phosphines (trioctylphosphine, triphenolphosphine, t-butylphosphine), phosphine oxides (trioctylphosphine oxide), alkyl-amine (hexadecylamine, octylamine), ary-amines, pyridines, and thiophenes.

The outer most layer (capping agent) can consist of a coordinated ligand that processes a functional group that can be used as a chemical linkage to other inorganic, organic or biological material such as but not restricted to:—mercapto-functionalized amines or mercaptocarboxylic acids.

The outer most layer (capping agent) can consist of a coordinated ligand that processes a functional group that is polymerisable and can be used to form a polymer around the particle, polymerisable ligands such as but not limited to styrene functionalized amine, phosphine or phosphine oxide ligand.

Nanoparticle Shape

The shape of the nanoparticle is not restricted to a sphere and can consist of but not restricted to a rod, sphere, disk, tetrapod or star. The control of the shape of the nanoparticle is by the addition of a compound that will preferentially bind to a specific lattice plane of the growing particle and subsequently inhibit or slow particle growth in a specific direction. Example of compounds that can be added but is not restricted to include:—phosphonic acids (n-tetradecylphosphonic acid, hexylphosphonic acid, 1-decanesulfonic acid, 12-hydroxy-dodecanoic acid, n-octadecylphosphonic acid).

Description of Preparative Procedure

The current invention should lead to pure, monodispersed, nanocrystalline particles of the materials as described above, that are stabilized from particle aggregation and the surrounding chemical environment by a capping agent, such as an organic layer.

Synthetic Method Employed

The synthetic method employed to produce the initial core and core-shell material can either be by the conventional method of high temperature rapid injection "nucleation and growth" as in the fourth aspect of the present invention or where larger quantities of material is required by a seeding process using of a molecular cluster with dual precursors in accordance with the first and fourth aspects of the present invention.

Further consecutive treatment of the as formed nanoparticles (ZnS and $Cd_xZn_{1-x}S$) to form core-shell and then quantum dot-quantum well particles may be undertaken. Core-shell particle preparation is undertaken either before or after nanoparticle isolation, whereby the nanoparticles are isolated from the reaction and redissolved in new (clean) capping agent/solvent, this can result in a better quantum yield.

For II-VI material, a source for II and a source for VI precursor are added to the reaction mixture and can be either in the form of two separate precursors one containing I element, and the other containing VI element or as a single-source precursor that contains both II and VI within a single molecule to form a core or shell layer of II-VI material (e.g. where II=Cd, Zn, VI=S, Se).

For I-III-$VI_2$ material, a source for I (group 11 of the periodic table), a source for III and a source for VI element precursor are added to the reaction mixture and can be either in the form of three separate precursors one containing I element, one containing III element and the other containing VI or as a single-source precursor that contains both I and VI and III and VI within a single molecules to form the I-III-$VI_2$ layer (where I=Cu and III=In, Ga and VI=S, Se), or a single-source precursor which contains all three elements.

For II-V material, a source for II and a source for V precursor are added to the reaction mixture and can be either in the form of two separate precursors one containing a group II element, and the other containing V element or as a single-source precursor that contains both II and V within a single molecule to form a core or shell layer of II-V material (where II=Zn, Cd, Hg V=N, P, As, Sb, Bi).

For III-V material, a source for III and a source for V precursor are added to the reaction mixture and can be either in the form of two separate precursors one containing III, and the other containing V or as a single-source precursor that contains both III and V within a single molecules to form a core or shell layer of III-V material (where III=In, Ga, Al, B, V=N, P, As, Sb, Bi).

For IV-VI material, a source for IV and a source for VI precursor are added to the reaction mixture and can be either in the form of two separate precursors one containing IV element, and the other containing VI element or as a single-source precursor that contains both IV and VI within a single molecule to form a core or shell layer of IV-VI material (where IV=Si, C, Ge, Sn, Pb VI=S, Se, Te).

The process may be repeated with the appropriate element precursors until the desired quantum dot-quantum well or core/multi-shell material is formed. The nanoparticles size and size distribution in an ensemble of particles is dependent on the growth time, temperature and concentrations of reactants in solution, with higher temperatures generally producing larger nanoparticles.

Precursor Materials Used to Grow the Quantum Dot-Quantum Well Structures Core Material Source—Multi-Source Precursor Materials Metal Ions For a compound semiconductor nanoparticle comprising a core semiconductor material of, for example, (ZnS)L or $(Cd_xZn_{1-x}S)L$ (where L is a ligand or capping agent) a source for element Zn and Cd is further added to the reaction and can consist of any Zn or Cd-containing compound that has the ability to provide the growing particles with a source of Zn or Cd ions. The precursor can comprise but is not restricted to an organometallic compound, an inorganic salt, a coordination compound or the element.

Examples for II-VI, for the first element include but are not restricted to:—

Organometallic such as but not restricted to a $MR_2$ where M=Mg R=alky or aryl group ($Mg^tBu_2$); $MR_2$ where M=Zn, Cd; R=alky or aryl group ($Me_2Zn$, $Et_2Zn$ $Me_2Cd$, $Et_2Cd$); $MR_3$.

Coordination compound such as a carbonate or a β-diketonate or derivative thereof, such as acetylacetonate (2,4-pentanedionate) $[CH_3COOCH=C(O-)CH_3]_2$ M=Zn, Cd,;

Inorganic salt such as but not restricted to a Oxides ZnO, CdO, Nitrates $Mg(NO_3)_2$, $Cd(NO_3)_2$, $Zn(NO_3)_2$, $M(CO_3)_2$ M=Zn, Cd,; $M(CH_3CO_2)_2$ M=Zn, Cd, An element Zn, Cd, Non-Metal Ions For a compound semiconductor nanoparticle comprising, for example, $(ZnE)_nL_m$ or $(Cd_xZn_{(1-x)}E)_nL_m$, a source of E ions, where E is a non-metal, for example, sulfur or selenium, is further added to the reaction and can consist of any E-containing compound that has the ability to provide the growing particles with a source of E ions. n and m are numerical values selected to provide the desired compound. L is a ligand, such as a capping agent. The precursor can comprise but is not restricted to an organometallic compound, an inorganic salt, a coordination compound or an elemental source.

Examples for an II-VI, semiconductor where the second elements include but are not restricted to:—

$ER_2$ (E=S or Se; R=Me, Et, $^tBu$, $^iBu$ etc.); HER (E=S or Se; R=Me, Et, $^tBu$, $^iBu$, $^iPr$, Ph etc); thiourea $S=C(NH_2)_2$.

An element S or Se. An elemental source can be used whereby the element is directly added to the reaction or is coordinated to a σ-donor Lewis base compound (two electron pair donor); such as elemental sulfur or selenium coordinating to TOP (tri-octyl-phosphine) to form TOPS and TOPSe respectively or the use of other Lewis bases such as phosphines, amines or phosphine oxides but not restricted to, such as in the case of using octylamine to coordinate sulfur.

Core Material Source—Single-Source Precursor Materials

For a compound semiconductor nanoparticle comprising, for example, elements ZnS or $Cd_xZn_{(1-x)}S$ a source for Zn or Cd and S can be in the from of a single-source precursor, whereby the precursor to be used contains both Zn or Cd and S within a single molecule. This precursor can be an organometallic compound and inorganic salt or a coordination compound, $(Zn_aS_b)L_c$ or $(Cd_xZn_{(1-x)}S)_nL_m$ Where Zn or Cd and S are the elements required within the nanoparticles and L is the capping ligands.

Examples for an II-VI semiconductor where M=II and E=VI element can be but is not restricted to bis(dialkyldithiocarbamato)M,(II) complexes compounds of the formula $M(S_2CNR_2)_2$ M=Zn, Cd,; S=S, and R=alkyl or aryl groups; CdS $Cd[SSiMe_3]_2$, $Cd(SCNHNH_2)_2Cl_2$, $Cd(SOCR)_2$.py; $[RME^tBu]_5$ M=Zn, Cd; E=S,; R=Me, Et, Ph; $[X]_4[E_4M_{10}(SR)_{16}]$ E=S, M=Zn, Cd; $X=Me_3NH^+$, $Li^+$, $Et_3NH^+$ R=Me, Et, Ph; $[Cd_{32}S_{14}(SPh)_{36}].L$; $[M_4(SPh)_{12}]^+[X]_2^-$ M Zn, Cd, $X=Me_4N^+$, $Li^+$; $[Zn(SEt)Et]_{10}$: [MeMe$^i$Pr] M=Zn, Cd, E=S; $[RCdSR']_5$ $R=O(ClO_3)$, $R'=PPh_3$, $^iPr$; $[Cd_{10}S_4(S'Ph)_{12}(PR_3)_4]$. $[(^tBu)GaSe]_4$; $[^tBuGaS]_7$; $[RInSe]_4$ $R=^tBu$, $CMe_2Et$, $Si(^tBu)_3$, $C(SiMe_3)_3$; $[RInS]_4$ $R=^tBu$, $CMe_2Et$; $[RGaS]_4$ $R=^tBu$, $CMe_2Et$, $CEt_3$; $[SAlR']_4$ $R=C(SMe_3)_3$, $CEtMe_2$; $[(C(SiMe_3)_3)GaS]_4$; $[^tBuGaS]_6$; $[RGaSe]_4$ $R=^tBu$, $CMe_2Et$, $CEt_3$, $C(SiMe_3)_3$, $Cp^*$, $[Cu_{12}Se_6(PR_3)_8]$ $R=Et_2Ph$, $^nPr_3$, $Cy_3$.

First Semiconductor Materials

For Use in First Layer

For a compound semiconductor quantum dot-quantum well nanoparticle comprising a first layer of, for example, I-III-VI$_2$ or II-VI material, sources for element I, III, VI or II are added to the reaction and can consist of any I, III, VI or II-containing compound that has the ability to provide the growing particles with a source of E ions. The precursor can consist of but are not restricted to an organometallic compound, an inorganic salt, a coordination compound or an elemental source. Examples include but are not restricted to:—

Group I Source (e.g. Cu)

But is not restricted to:—

CuX where X=Cl, Br, I; Copper(II) acetate$(CH_3CO_2)_2Cu$, Copper(I) acetate $CH_3CO_2Cu$, copper(II) acetylacetonate $[CH_3COCH=C(O^-)CH_3]_2Cu$ and other β-diketonate, copper(I) butanethioate $CH_3(CH_2)_3SCu$, Copper(II)nitrate $Cu(NO_3)_2$, CuO.

Group II Source (e.g. Mg)

Organometallic such as but not restricted to a $MR_2$ where M=Mg R=alky or aryl group ($Mg^tBu_2$); $MR_2$ where M=Zn, Cd; R=alky or aryl group ($Me_2Zn$, $Et_2Zn$ $Me_2Cd$, $Et_2Cd$); $MR_3$.

Coordination compound such as a carbonate or a β-diketonate or derivative thereof, such as acetylacetonate (2,4-pentanedionate) $[CH_3COOCH=C(O^-)CH_3]_2$ M=Zn, Cd;

Inorganic salt such as but not restricted to an Oxide, e.g. ZnO, CdO, a Nitrate, e.g. $Mg(NO_3)_2$, $Cd(NO_3)_2$, $Zn(NO_3)_2$, $M(CO_3)_2$ M=Zn, Cd; $M(CH_3CO_2)_2$ M=Zn, Cd, An element Zn, Cd, Group III Source (e.g. In and Ga)

But is not restricted to:—

$MR_3$ Where M=Ga, In, Al, B; R=alky or aryl group $[AlR_3, GaR_3, InR_3$ (R=Me, Et, $^iPr$)].

Coordination compound such as a β-diketonate or derivative thereof, such as $[CH_3COOCH=C(O^-)CH_3]_2$ M=Al, Ga, In.

Inorganic salt such as but not restricted to an Oxide, e.g. $In_2O_3$, $Ga_2O_3$; a Nitrate, e.g. $In(NO_3)_3$, $Ga(NO_3)_3$; $M(CH_3C)_3$ M=Al, Ga, In An element Ga, In.

Group VI Source (S or Se)

$MR_2$ (M=S, Se; R=Me, Et, $^tBu$, $^iBu$ etc.); HMR (M=S, Se; R=Me, Et, $^tBu$, $^iBu$, $^iPr$, Ph etc); thiourea $S=C(NH_2)_2$; $Se=C(NH_2)_2$.

An element S, Se. An elemental source can be used whereby the element is directly added to the reaction or is coordinated to a σ-donor Lewis base compound (two electron pair donor); such as elemental sulfur or selenium coordinating to TOP (tri-octyl-phosphine) to form TOPS and TOPSe respectively or the use of other Lewis bases such as phosphines, amines or phosphine oxides but not restricted to, such as in the case of using octylamine to coordinate sulfur.

First Semiconductor Materials—Single-Source Precursors

Examples for an II-VI semiconductor where M=II and E=VI element can be but is not restricted to bis(dialkyldithiocarbamato)M, (II) complexes compounds of the formula $M(S_2CNR_2)_2$ M=Zn, Cd,; S=S, and R=alkyl or aryl groups; CdS $Cd[SSiMe_3]_2$, $Cd(SCNHNH_2)_2Cl_2$, $Cd(SOCR)_2$.py; $[RME^tBu]_5$ M=Zn, Cd; E=S,; R=Me, Et, Ph; $[X]_4[E_4M_{10}(SR)_{16}]$ E=S, M=Zn, Cd; $X=Me_3NH^+$, $Li^+$, $Et_3NH^+$ R=Me, Et, Ph; $[Cd_{32}S_{14}(SPh)_{36}].L$; $[M_4(SPh)_{12}]^+[X]_2^-$ M=Zn, Cd, $X=Me_4N^+$, $Li^+$; $[Zn(SEt)Et]_{10}$: [MeMe$^i$Pr] M=Zn, Cd, E=S; $[RCdSR']_5$ $R=O(ClO_3)$, $R'=PPh_3$, $^iPr$; $[Cd_{10}S_4(S'Ph)_{12}(PR_3)_4]$. $[(^tBu)GaSe]_4$; $[^tBuGaS]_7$; $[RInSe]_4$ $R=^tBu$, $CMe_2Et$, $Si(^tBu)_3$, $C(SiMe_3)_3$; $[RInS]_4$ $R=^tBu$, $CMe_2Et$; $[RGaS]_4$ $R=^tBu$, $CMe_2Et$, $CEt_3$; $[SAlR']_4$ $R=C(SMe_3)_3$, $CEtMe_2$; $[(C(SiMe_3)_3)GaS]_4$; $[^tBuGaS]_6$; $[RGaSe]_4$ $R=^tBu$, $CMe_2Et$, $CEt_3$, $C(SiMe_3)_3$, $Cp^*$, $[Cu_{12}Se_6(PR_3)_8]$ $R=Et_2Ph$, $^nPr_3$, $Cy_3$.

Second Semiconductor Materials

For Use in Second, Outer or any Other Subsequent Layers

The precursor(s) used to provide the second semiconductor material may be chosen from the same lists of materials set out above in respect of the first semiconductor material.

For a quantum dot-quantum well with the second or outer most layer comprising, for example, $(ZnS)_nL_m$ or $(Cd_xZn_{(1-x)}S)_nL_m$ a source for element Zn and Cd is further added to the reaction and can consist of any Zn or Cd-containing compound that has the ability to provide the growing particles with a source of Zn or Cd ions. The precursor can consist of but are not restricted to an organometallic compound, an inorganic salt, a coordination compound or the element.

Examples for II-VI, for the first element include but are not restricted to:—

Organometallic such as but not restricted to a $MR_2$ where M=Mg R=alky or aryl group ($Mg^tBu_2$); $MR_2$ where M=Zn, Cd; R=alky or aryl group ($Me_2Zn$, $Et_2Zn$ $Me_2Cd$, $Et_2Cd$); $MR_3$.

Coordination compound such as a carbonate or a β-diketonate or derivative thereof, such as acetylacetonate (2,4-pentanedionate) $[CH_3COOCH=C(O^-)CH_3]_2$ M=Zn, Cd,;

Inorganic salt such as but not restricted to a Oxides ZnO, CdO, Nitrates $Mg(NO_3)_2$, $Cd(NO_3)_2$, $Zn(NO_3)_2$, $M(CO_3)_2$ M=Zn, Cd,; $M(CH_3CO_2)_2$ M=Zn, Cd, An element Zn, Cd.

Non-Metal Ions

For a compound semiconductor nanoparticle comprising, for example $(ZnS)_nL_m$ or $(Cd:ZnS)_nL_m$ a source for non-metal ions, E, e.g. sulfur is further added to the reaction and can consist of any E-containing compound that has the ability to provide the growing particles with a source of E ions. The precursor can consist of but are not restricted to an organometallic compound, an inorganic salt, a coordination compound or an elemental source. Examples for an II-VI, semi-conductor where the second elements include but are not restricted to:—

$MR_2$ (M=S; R=Me, Et, $^tBu$, $^iBu$ etc.); HMR (M=S; R=Me, Et, $^tBu$, $^iBu$, $^iPr$, Ph etc); thiourea $S=C(NH_2)_2$.

An element S or Se. An elemental source can be used whereby the element is directly added to the reaction or is coordinated to a σ-donor Lewis base compound (two electron pair donor); such as elemental sulfur or selenium coordinating to TOP (tri-octyl-phosphine) to form TOPS and TOPSe respectively or the use of other Lewis bases such as phosphines, amines or phosphine oxides but not restricted to, such as in the case of using octylamine to coordinate sulfur.

Second Semiconductor Materials—Single-Source Precursors

For a compound semiconductor nanoparticle comprising of elements ZnS or $Cd_xZn_{(1-x)}S$ a source for Zn or Cd and S source can also be in the from of a single-source precursor, whereby the precursor to be used contains both Zn or Cd and S within the single molecule. This precursor can be an organometallic compound and inorganic salt or a coordination compound, $(Zn_aS_b)L_c$ or $(Cd_xZn_{(1-x)}S)_nL_m$ Where Zn or Cd and S are the elements required within the nanoparticles and L is the capping ligands.

Examples for an II-VI semiconductor were M=II and E=VI element can be but is not restricted to bis(dialkyldithio-carbamato)M, (II) complexes compounds of the formula $M(S_2CNR_2)_2$ M=Zn, Cd,; S=S, and R=alkyl or ary groups; CdS $Cd[SSiMe_3]_2$, $Cd(SCNHNH_2)_2Cl_2$, $Cd(SOCR)_2$.py; $[RME^tBu]_5$ M=Zn, Cd; E=S; R=Me, Et, Ph: $[X]_4[E_4M_{10}(SR)_{16}]$ E=S, M=Zn, Cd; X=$Me_3NH^+$, $Li^+$, $Et_3NH^+$: $[Cd_{32}S_{14}(SPh)_{36}]$.L: $[M_4(SPh)_{12}]^+[X]_2^-$ M=Zn, Cd; X=$Me_4N^+$, $Li^+$: $[Zn(SEt)Et]_{10}$: [MeMe$^i$Pr] M=Zn, Cd; E=S,: $[RCdSR']_5$ R=$O(ClO_3)$, R'=$PPh_3$, $^iPr$: $[Cd_{10}S_4(S'Ph)_{12}(PR_3)_4]$

DETAILED DISCUSSION

The synthesis of quantum dot-quantum wells is preferably a three-step process, optionally involving isolation of the product of a step prior to further modification to provide the next layer of the nanoparticle structure. By way of example, for the nanoparticle, ZnS/CdSe/$Cd_xZn_{1-x}S$, the cores are synthesized and isolated from a growth solution and the first shell is grown onto the cores in a separate reaction and isolated once again. Finally an outer $Cd_xZn_{1-x}S$ shell layer is grown onto the core-shell structure to produce the ZnS/CdSe/$Cd_xZn_{1-x}S$ quantum dot-quantum well.

Synthesis of ZnS Cores

Zinc sulfide (or cadmium/zinc sulphide) particles were synthesized by a number of methods when a small quantity was needed by decomposing $[Et_3NH]_4[Zn_{10}S_4(SPh)_{16}]$ clusters in HDA at 180° C. and heating to 250° C. or 300° C. to produce 2 nm or 5.5 nm diameter ZnS particles.

Synthesis of ZnS/CdSe Core Shell Dots

Either a combination of two precursors was used such as $Me_2Cd$ and TOPSe or a single-source precursor such as $[Et_3NH]_4[Cd_{10}Se_4(SPh)_{16}]$ was used as precursors for the formation of the CdSe layer. The precursors decompose onto the ZnS cores enabled the synthesis of multi-gram quantities of ZnS/CdSe core-shell particles.

Quantum Well Modifications ZnS/CdSe/$Cd_xZn_{1-x}S$

Growth of the $Cd_xZn_{1-x}S$ shell is performed at a low temperature and added very slowly to prevent thick shell growth and renucleation of CdSe nanoparticles. The likelihood of alloying is minimal at this growth temperature. The ZnS/CdSe core-shell nanocrystals exhibit quantum efficiencies of about 3%. The growth of the outer $Cd_xZn_{1-x}S$ also shifts the emission and the first absorption feature by about 2 nm. Again, similar shifts in the emission/absorption are common with CdSe or CdS overcoated with ZnS.

Cadmium-Free Quantum Dot-Quantum Wells

There is also a great need for quantum dots that perform similarly to CdSe—ZnS core-shell quantum or quantum dot-quantum wells that are cadmium free. Nanoparticles in accordance with the present invention may therefore be produced which include a layer of cadmium-free semiconductor material in place of a cadmium-containing layer. For example, the nanoparticles ZnS/$CuInS_2$/ZnS and ZnS/$CuInSe_2$/ZnS can be produced in accordance with the method of the present invention and used in place of ZnS/CdS/ZnS and ZnS/CdSe/ZnS.

ZnS/$CuInS_2$ Core/Shell Structure

This was achieved by using either a combination of precursors each containing just one element required within the final composite nanoparticle or by the use of single-source precursors which contain all or more than one element required within the final composite.

Multi-Source Precursors

ZnS core particles were dissolved in warm capping agent/solvent such as HDA-hexanethiol or TOPO-hexanethiol followed by the addition of a copper source, an indium source and a sulfur source such as CuI dissolved in an amine, $InI_3$ dissolved in an amine and sulfur coordinated to TOP to give TOPS. The growth of the $CuInS_2$ shell onto the ZnS cores is achieved by the addition of the above precursors to the HDA-hexanethiol solution while increasing the temperature between 150° and 300° C. The solution was then cooled to 150° C. before further precursor additions, this being repeated until the desired emission wavelength was achieved. The particles-containing solution was then cooled and the particles isolated using excess methanol.

Single-Source Precursors

Single-source precursors may be used such as $(Ph_3P)_2CuIn(SEt)_4$ or a combination of single-source precursors such as $In(S_2CNEt_2)_3$ and $Cu(S_2CNEt_2)_2$.

ZnS/$CuInSe_2$ Core/Shell Structure

This was achieved by using either a combination of precursors each containing just one element required within the final composite nanoparticle or by the use of single-source precursors which contain all or more than one element required within the final composite.

Multi-Source Precursors

ZnS core particles were dissolved in warm capping agent/solvent such as HDA or TOPO-hexanethiol mix followed by the addition of a copper source an indium source and a selenium source such as CuI dissolved in an amine, $InI_3$ dissolved in an amine and selenium coordinated to TOP to give TOPSe. The growth of the $CuInSe_2$ shell onto the ZnS cores is achieved by the addition of the above precursors to the HDA-hexanethiol solution while increasing the temperature between 150° and 300° C. The solution was then cooled to 150° C. before further additions, this being repeated until the desired emission wavelength was achieved. The particles containing solution was then cooled and the particles isolated using excess methanol.

Single-Source Precursors

Single-source precursors may be used such as $(Ph_3P)_2CuIn(SeEt)_4$ or a combination of single-source precursors such as $In(Se_2CNEt_2)_3$ and $Cu(Se_2CNEt_2)_2$.

ZnS/CuInS$_2$/ZnS and ZnS/CuInSe$_2$/ZnS Core/Multishell Nanoparticles

The amount of zinc and sulfur precursor used was varied depending on the thickness of the outer ZnS shell required. ZnS/CuInS$_2$ or ZnS/CuInSe$_2$ particles were added to degassed HDA at 70° C. and heated to 180-200° C. Me$_2$Zn and sulfur solutions were used to grow the outer ZnS layers by dropwise addition until the desired ZnS shell thickness was reached.

By the use of an in situ optical probe, moreover, an Ocean Optics USB2000 spectrometer, the progressive formation/growth of the core, core-shell or quantum-well particle can be followed by the maximum of the photoluminescence emission peak or the maximum of the absorption spectra, when the required the photoluminescence emission was achieved the reaction was stopped by cooling the reaction solution.

The present invention is illustrated with reference to the following figures and non-limiting Example and Reference Examples, in which:

FIG. 1 is an illustration of a) Core nano-particle comprising of a ZnS core and HDA as an organic capping agent, b) core-shell particle comprising of a ZnS core a CdSe shell and HDA as an organic capping agent, c) quantum dot-quantum well organic capped particle comprising of a ZnS core a CdSe shell followed by a $Cd_xZn_{1-x}S$ shell with a HDA capping agent;

FIG. 2 is an illustration of a) Core nano-particle comprising of a ZnS core and HDA as an organic capping agent, b) core-shell particle comprising of a ZnS core a CdSe shell and HDA as an organic capping agent, c) quantum dot-quantum well organic capped particle comprising of a ZnS core a CdSe shell followed by a ZnS shell with a HDA capping agent d) quantum dot-multi quantum well comprising of a ZnS core a CdSe shell followed by a shell of CdS followed by another shell of ZnS with a HDA capping agent;

EXAMPLES

Figure 1:
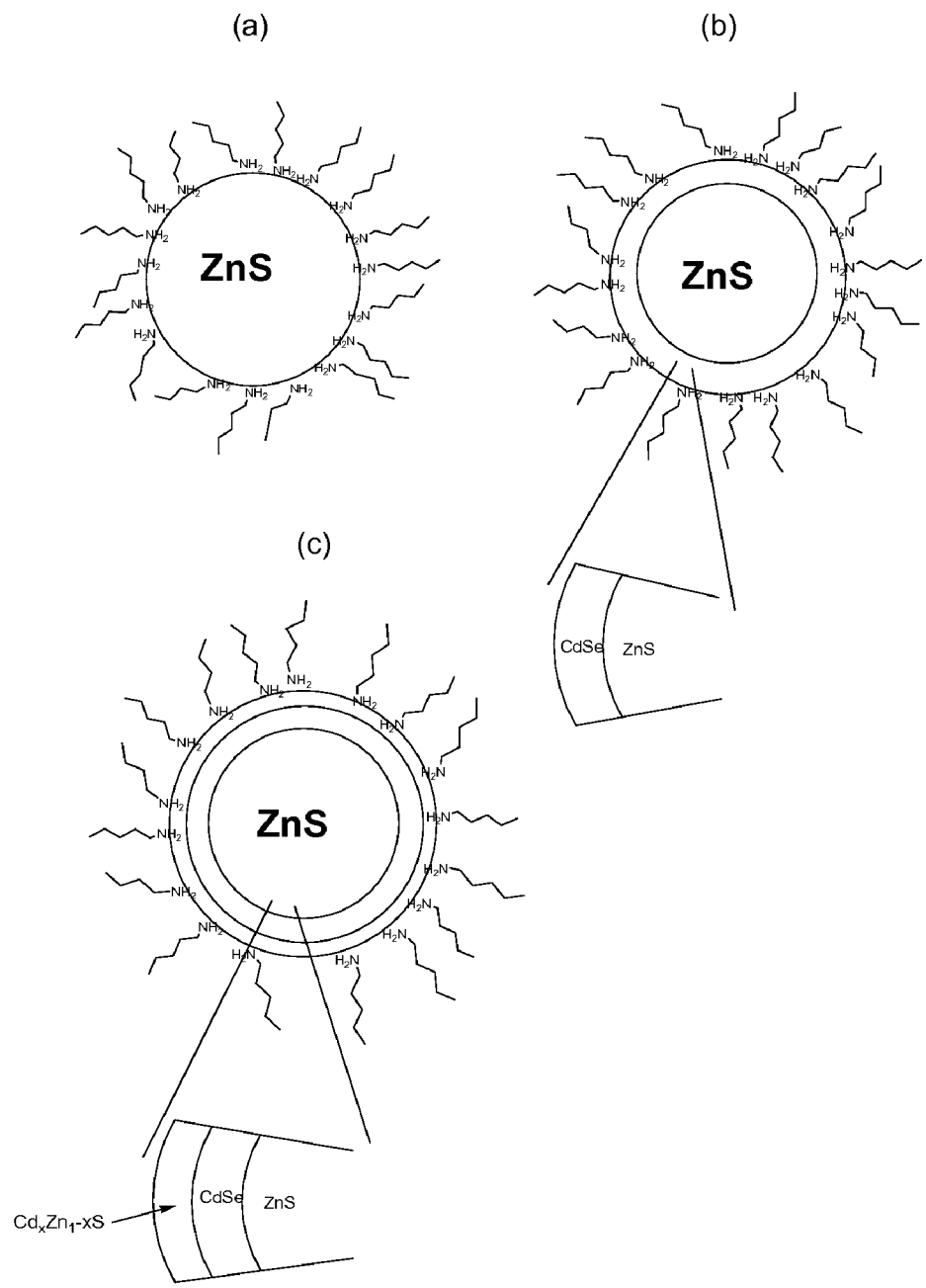
Figure 2:
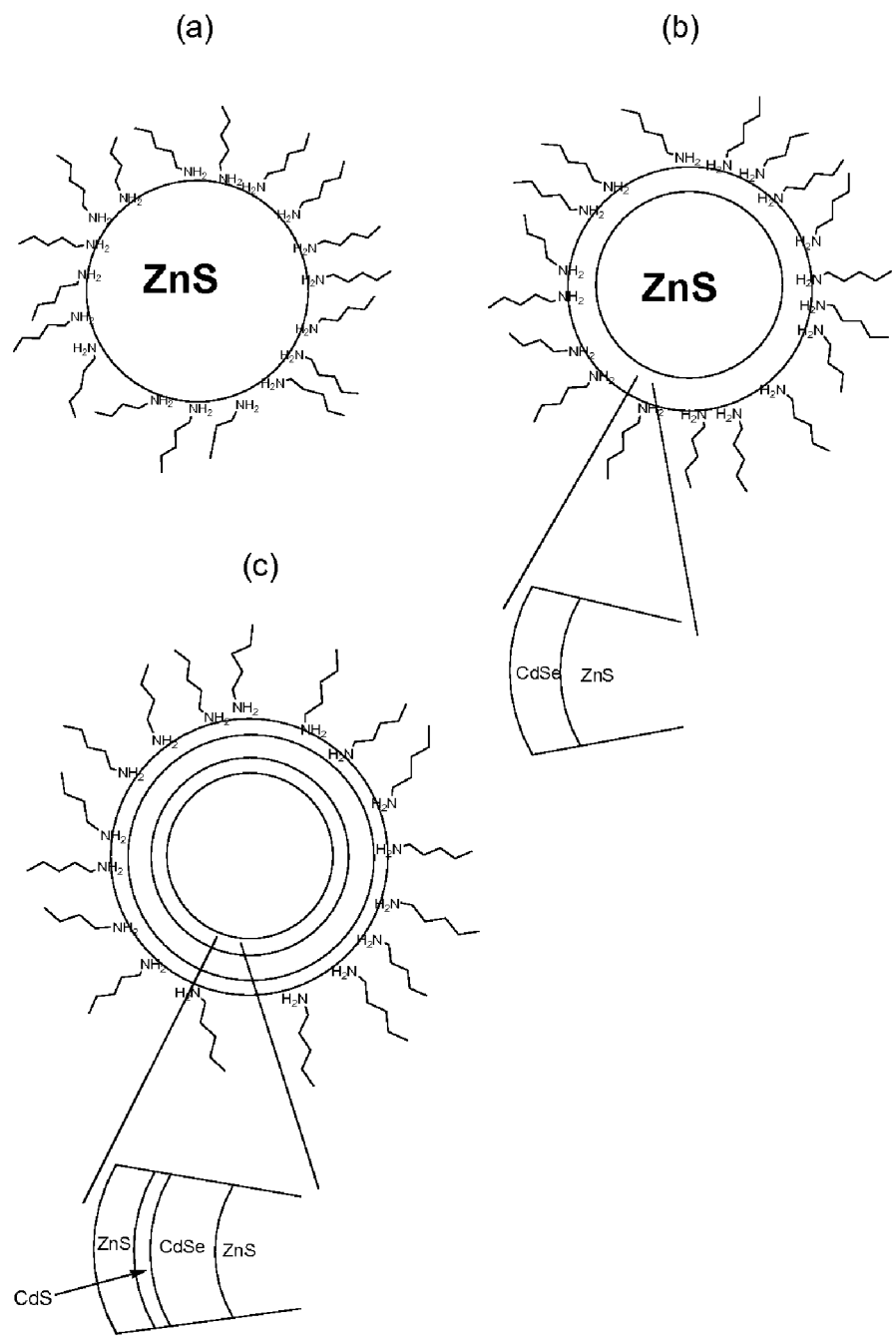
Figure 3:
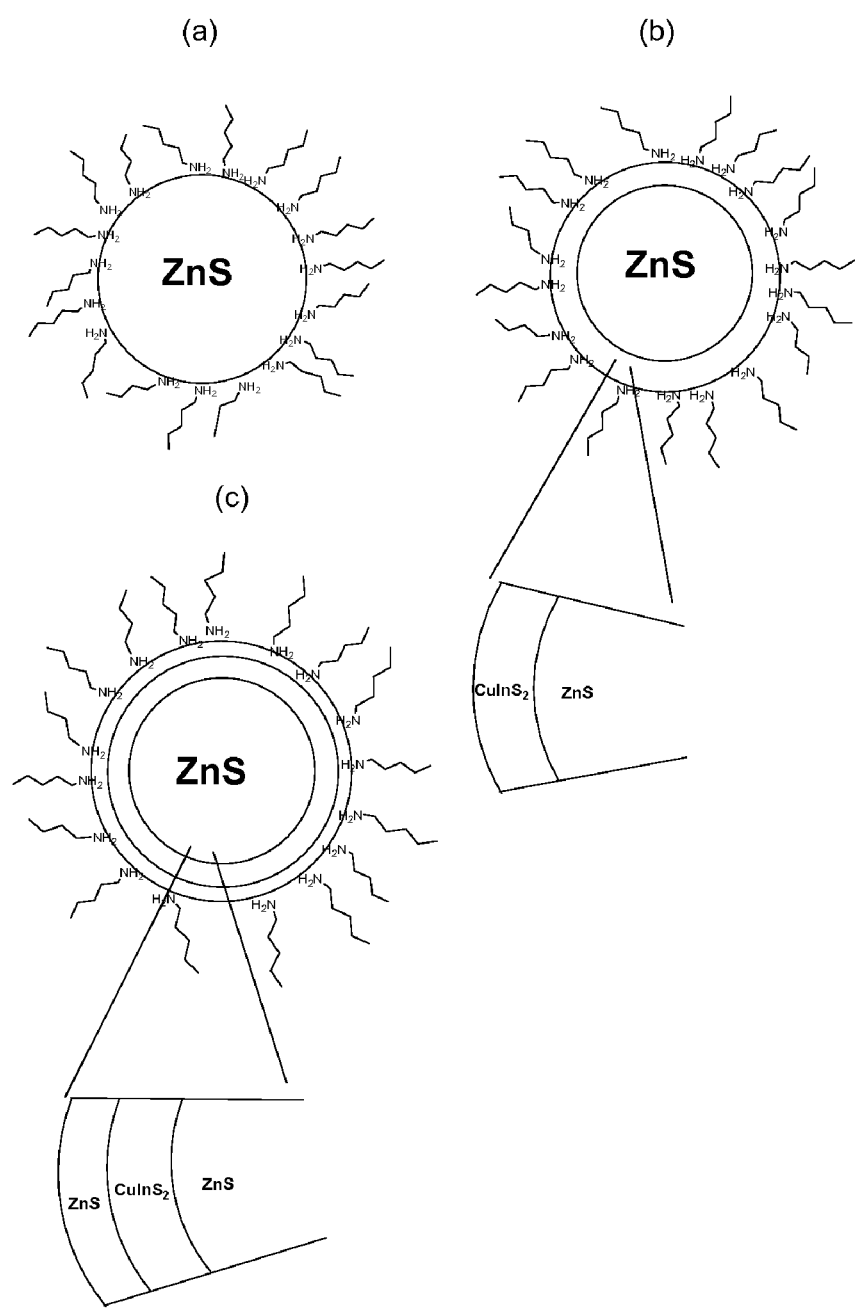
FIG. 3 is a diagram of a) core particle comprising of a ZnS core and HDA as an organic capping agent, b) core-shell particle comprising of a ZnS core a CuInS$_2$ shell and HDA as an organic capping agent, c) quantum dot-quantum well organic capped particle comprising of a ZnS core a CuInS$_2$ central layer followed by a ZnS shell with a HDA capping agent.
Figure 4:
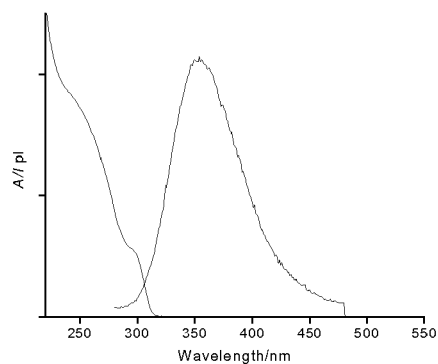
FIG. 4 illustrates properties of ZnS core quantum dots a) excitation (to the left) and emission spectra of 5.5 nm ZnS nanocrystals. (b) Powder x-Ray diffraction pattern of 5.5 µm. (c) Transmission electron micrograph (TEM) image of 5.5 nm ZnS core. Inset shows a high-resolution image of a single ZnS particle.
Figure 4:
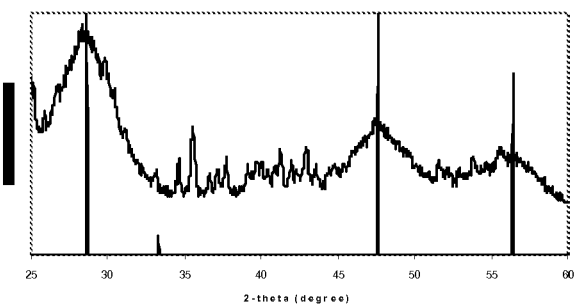
Figure 4:
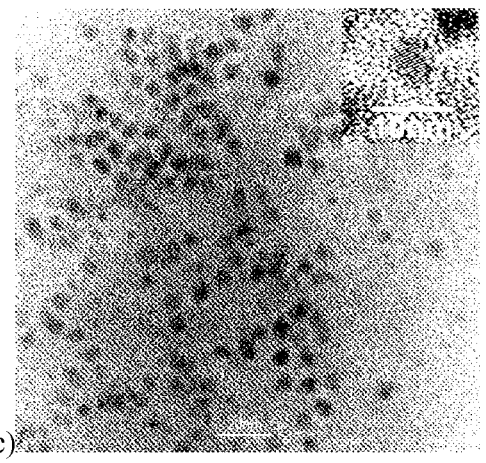
Figure 5:
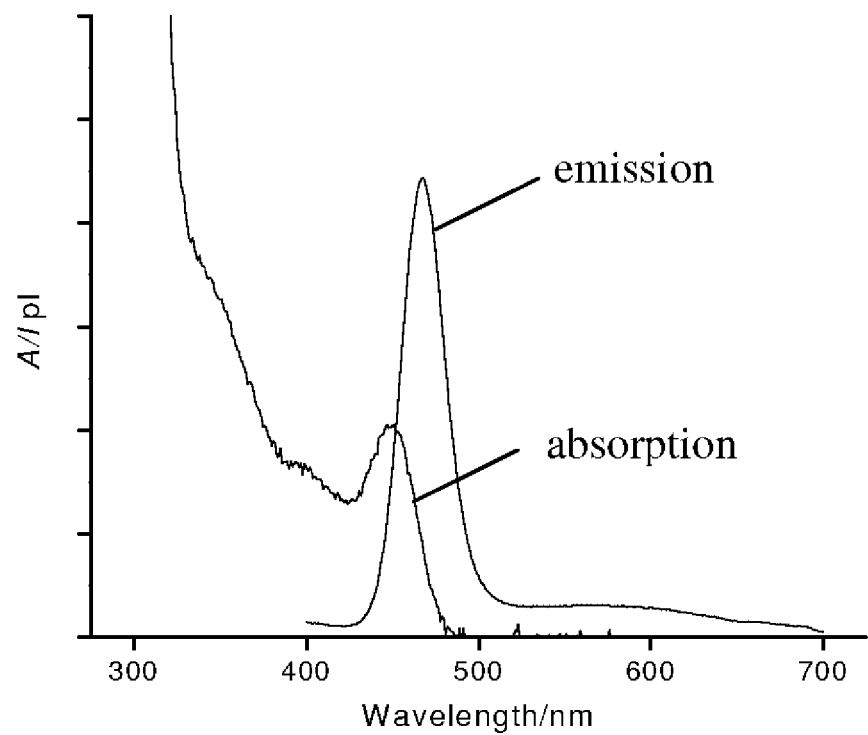
FIG. 5 shows absorption and photoluminescence spectra for a core-shell ZnS—CdSe quantum dots with an outer capping layer of hexadecylamine (HDA), with the absorption maximum at 440 nm and the emission maximum at 460 nm.
Figure 6:
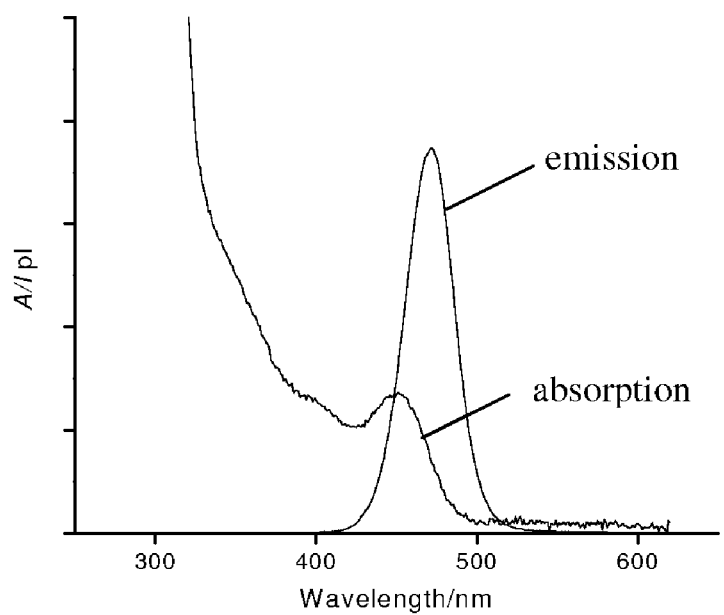
FIG. 6 shows absorption and PL spectra of ZnS/CdSe/$Cd_xZn_{(1-x)}S$ quantum well nanocrystals. The longest wavelength adsorption feature occurs at λ=453 nm and the maximum emission peak is at λ=472 nm.

All syntheses and manipulations were carried out under a dry oxygen-free argon or nitrogen atmosphere using standard Schlenk or glove box techniques. All solvents were distilled from appropriate drying agents prior to use (Na/K-benzophenone for THF, Et$_2$O, toluene, hexanes and pentane). HDA, octylamine, hexanethiol, dioctylphalate, TOP, $Cd(CH_3CO_2)_2$, sulfur, selenium powder, $CdO_2$, $CdCO_3$, InI, CuI (Adrich) were procured commercially and used without further purification.

UV-vis absorption spectra were measured on a Heλiosβ Thermospectronic. Photoluminescence (PL) spectra were measured with a Fluorolog-3 (FL3-22) photospectrometer at the excitation wavelength 380 nm. Powder X-Ray diffraction (PXRD) measurements were preformed on a Bruker AXS D8 diffractometer using monochromated Cu—K$_\alpha$ radiation.

Cluster Preparation

Preparation of $[HNEt_3]_2[Zn_4(SPh)_{10}]$

To a stirred methanol (360 ml) solution of benzenethiol (168 ml, 1.636 mmol) and triethylamine (229 ml, 1.64 mmol) was added dropwise $Zn(NO_3)_2 6H_2O$ (189 g, 0.635 mol) that had previously been dissolved in methanol (630 ml). The solution was then allowed to stir while warming until the precipitate had completely dissolved to leave a clear solution. This was then place at 5° C. for 24 h in which time large colourless crystals of $[HNEt_3]_2[Zn_4(SPh)_{10}]$ had formed (169 g).

Preparation of $[HNEt_3]_4[Zn_{10}S_4(SPh)_{16}]$

To a stirred acetonitrile (100 ml) solution of $[HNEt_3]_2[Zn_4(SPh)_{10}]$ (168.9 g, 0.1086 mol) was added 3.47 g (0.1084 mmol) of sulfur powder, the resulting slurry was left to stirrer for 10 minutes. A further 750 ml of acetonitrile was added and the solution warmed to 75° C. to give a clear pale yellow solution which was allowed to cool to 5° C., yielding large colourless crystals (74.5 g). The crystals were washed in hexane to give 71.3 g of $[HNEt_3]_4[Zn_{10}S_4(SPh)_{16}]$.

Preparation of Quantum Dot Cores (ZnS or $Cd_xZn_{(1-x)}S$)

Method 1—Preparation of ZnS Nanoparticles from $[Et_3NH]_4[Zn_{10}S_4(SPh)_{16}]$/TOPS/Me$_2$Zn in HDA by dropwise addition of Me$_2$Zn.TOP HDA was placed in a three-neck round bottomed flask and dried and degassed by heating to 120° C. under a dynamic vacuum for >1 hour. The solution was then cooled to 60° C. To this was added $[HNEt_3]_4[Zn_{10}S_4(SPh)_{16}]$. Initially 4 mmol of TOPS and 4 mmols of Me$_2$Zn.TOP were added to the reaction at room temperature and the temperature increased and allowed to stir for 2 hours. The temperature was progressively increased at a rate of ~1° C./5 min with equimolar amounts of TOPS and Me$_2$Zn.TOP being added dropwise as the temperature was steadily increased. The reaction was stopped when the PL emission maximum had reached the required emission, by cooling to 60° C. followed by addition of 300 ml of dry ethanol or acetone. This produced was isolated by filtration. The resulting ZnS particles which were recrystallized by re-dissolving in toluene followed by filtering through Celite followed by re-precipitation from warm ethanol to remove any excess HDA, selenium or cadmium present.

Method 2 (For Reference Purposes Only)

2 nm cores were prepared in 250 g hexadecylamine (HDA) which was previously degassed at 120° C. for one hour then, under nitrogen, $[Et_3NH]_4[Zn_{10}S_4(SPh)_{16}]$ (4.75 g, 1.64 mmol) was added and the solution was heated to 250° C. for 30 minutes which resulted in the nucleation and growth of ZnS nanoparticles. The resulting solution was then cooled to 65° C. and the particles were isolated by the addition of 400 ml dry methanol giving 1.1 g ZnS particles with approximately 20% w/w of ZnS. To grow 5.5 nm ZnS, the above-mentioned procedure was repeated at 300° C. growth temperature for 30 minutes giving 0.69 g ZnS particles with approximately 33% w/w of ZnS.

Synthesis of ZnS/CdSe Composite Quantum Dots

Method 1

In a typical synthesis, 0.35 g ZnS cores (or approximately $4.9 \times 10^7$ particles) were added to 100 g of degassed HDA at 70° C., the solution was then heated to 150° C. The growth of the CdSe layer onto the ZnS core is, achieved by a successive addition of the cluster $[Et_3NH]_4[Cd_{10}Se_4(SPh)_{16}]$ to the ZnS-HDA solution, between 150 to 300° C. for two hours. The solution was cooled to 150° C. before the further addition of precursor. The ZnS/CdSe particles were then cooled and isolated with excess methanol.

Method 2

In a typical synthesis, ZnS cores were added to degassed and moisture-free HDA at 70° C., the solution was then heated to 150° C. The growth of the CdSe layer onto the ZnS core is achieved by a successive addition of $Me_2Cd.TOP$ and TOPSe to the ZnS-HDA solution, between 150 to 300° C. for two hours. The solution was then cooled to 150° C. before additional $Me_2Zn.TOP$ and TOPS were added, this was repeated until the desired emission wavelength was achieved.

Synthesis of ZnS/CdSe/$Cd_xZn_{1-x}S$

The amount of zinc, cadmium and sulfur precursor used was varied depending on the thickness of the outer $Cd_xZn_{1-x}S$ shell required. The synthesis of ZnS/CdSe/$Cd_xZn_{1-x}S$ 2.5 ml $Me_2Cd$ (0.05M), 2.5 ml $Me_2Zn$ (0.05M) solutions along with 5.0 ml 0.05M sulfur solution was added to the ZnS/CdSe cores to produce ZnS/CdSe/$Cd_xZn_{1-x}S$ nanoparticles.

REFERENCE EXAMPLES

Preparation of ZnS/InP/ZnS and ZnSe/InP/ZnSe Quantum Dot-Quantum Wells

Preparation of Core ZnS

Figure 7:
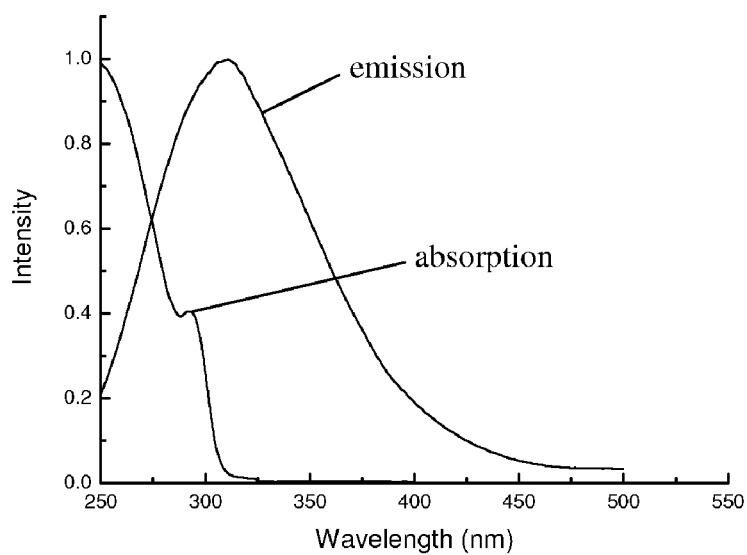
FIG. 7 shows absorption and PL spectra of ZnS cores.

HDA (250 g) was placed in a three neck flask and degassed at 120° C. under vacuum for one hour. At 100° C. $[Et_3NH_4]$ $[Zn_{10}S_4(SPh)_{16}]$ (10 g) was added and the solution was then heated to 300° C. for 30 minutes. After 30 minutes, the solution was cooled to 200° C. and the reaction mixture was annealed for one hour. The reaction mixture was left to cool overnight to room temperature. Particles of HDA coated ZnS were isolated by the addition of warm dry methanol (250 ml). The precipitation of white particles occurred these were isolated by centrifugation, washed with acetone and left to dry under nitrogen. Mass of product=1.7442 g. UV-vis and PL spectra of the ZnS cores are shown in FIG. 7.

Preparation of Core ZnSe

HDA (150 g) was placed in a three neck flask, dried and degassed at 120° C. for one hour. After one hour the mixture was cooled to 60° C. $[Zn_{10}Se_4(SPh)_{16}][Et_3NH_4]$ (5 g) was added to the HDA under nitrogen at 90° C. and left to stir for 5 mins before adding TOPSe (3.53 ml).

Figure 8:
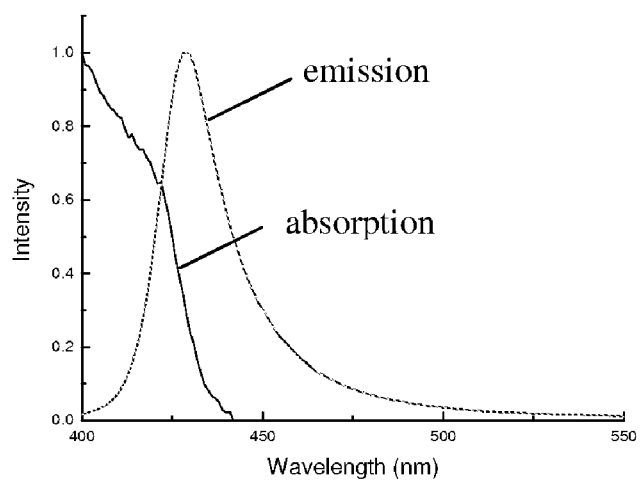
FIG. 8 shows absorption and PL spectra of ZnSe cores.

The reaction mixture changed colour from colorless to pale yellow. The temperature was increased to 120° C. The temperature of the reaction mixture was then increased gradually to 280° C. After 280° C. the reaction was left to cool. Once the temperature had decreased to 65° C., the particles were isolated by addition of methanol (250 ml) followed by centrifuged, washed with acetone and left to dry under nitrogen. Mass of product=1.2443 g. UV-vis and PL spectra of the ZnSe cores are shown in FIG. 8.

Preparation of Core-Shell ZnS/InP

Method (a)

Dibutyl ester (50 ml) and stearic acid (5.65 g) were dried/degassed by heating to between 65-100° C. under vacuum for 1 hour. The temperature was then increased to 180° C. followed by the addition of $InMe_3$ (1.125 ml), $(TMS)_3P$ (1.125 ml) and ZnS particles (0.235 g) and left to stir for 10 mins. The reaction mixture turned pale yellow after 5 mins of addition. When the reaction temperature had reached 200° C., further quantities of $InMe_3$ (2.25 ml) and $(TMS)_3P$ (2.25 ml) were added dropwise which resulted in the colour changing from pale yellow to clear bright orange, the temperature was subsequently increased to 220° C. This was followed by further addition of $InMe_3$ (3.375 ml) and $(TMS)_3P$ (3.375 ml) resulting in a dark red solution colour.

Figure 9A:
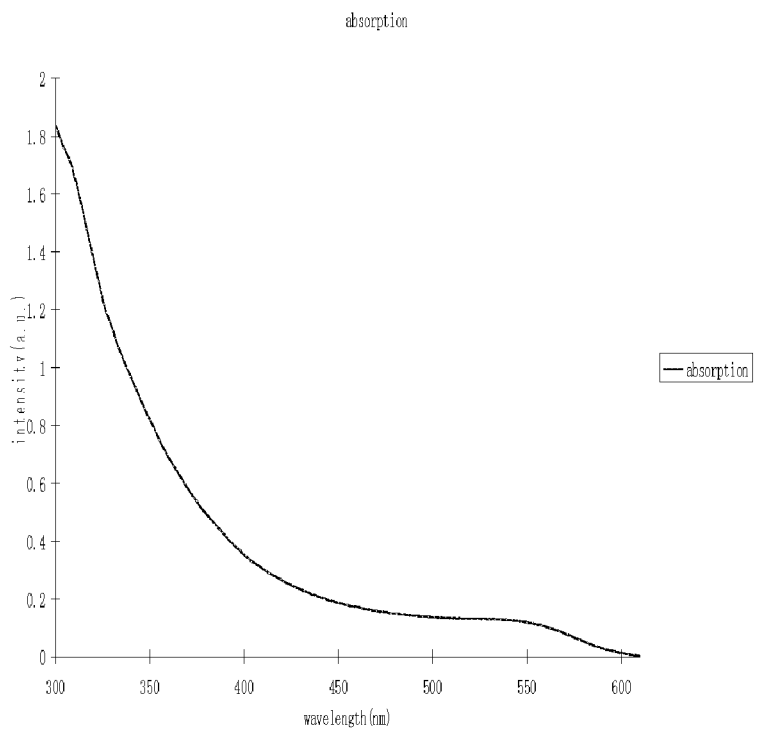
FIGS. 9A and 9B show absorption and PL spectra of ZnS/InP core/shell nanocrystals respectively.
Figure 9B:
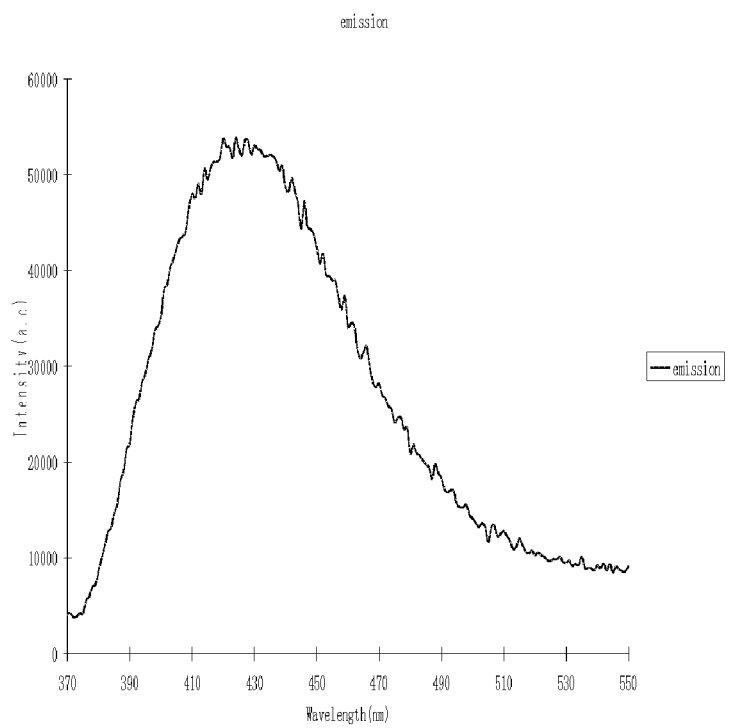

The reaction mixture was then left to anneal for 1 hour at 220° C. and then allowed to cool to room temperature. This was followed by isolation; by adding 100 ml of dry warm ethanol which produced a precipitate of orange/red particles which were isolated via centrifugation, washed with acetone and left to dry. Mass of product=2.29 g. UV-vis spectrum of the ZnS/InP core/shell particles is shown in FIG. 9A. PL spectrum of the ZnS/InP core/shell particles is shown in FIG. 9B.

Preparation of Core-Shell ZnS/InP

Method (b) (Using Larger Sized ZnS Core Particles)

Dibutyl ester (50 ml) and stearic acid (5.65 g) were dried/degassed by heating to between 65-100° C. under vacuum for 1 hour. The temperature was then increased to 180° C. and ZnS particles (0.5 g) along with $InMe_3$ (1.125 ml) and $(TMS)_3P$ (1.125 ml) were added dropwise under $N_2$ to the reaction solution this was left to stir for 10 mins, in which time the reaction mixture turned pale yellow. When the reaction temperature had reached 200° C., further addition of $InMe_3$ (2.25 ml) and $(TMS)_3P$ (2.25 ml) was made which resulted in the colour changing from pale yellow to clear bright orange. The temperature was then increased to 220° C., with further addition of $InMe_3$ (3.375 ml) and $(TMS)_3P$ (3.375 ml) resulting in the reaction solution turning a dark red solution colour.

Figure 10A:
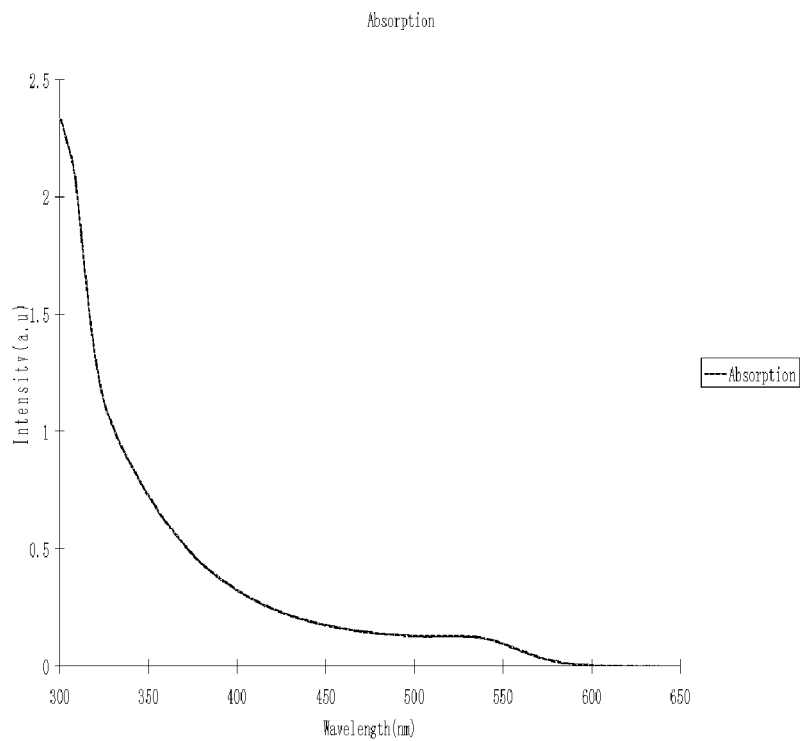
FIGS. 10A and 10B show absorption and PL spectra of ZnS/InP core/shell nanocrystals respectively in which the ZnS cores are larger than those shown in FIGS. 9A and 9B.
Figure 10B:
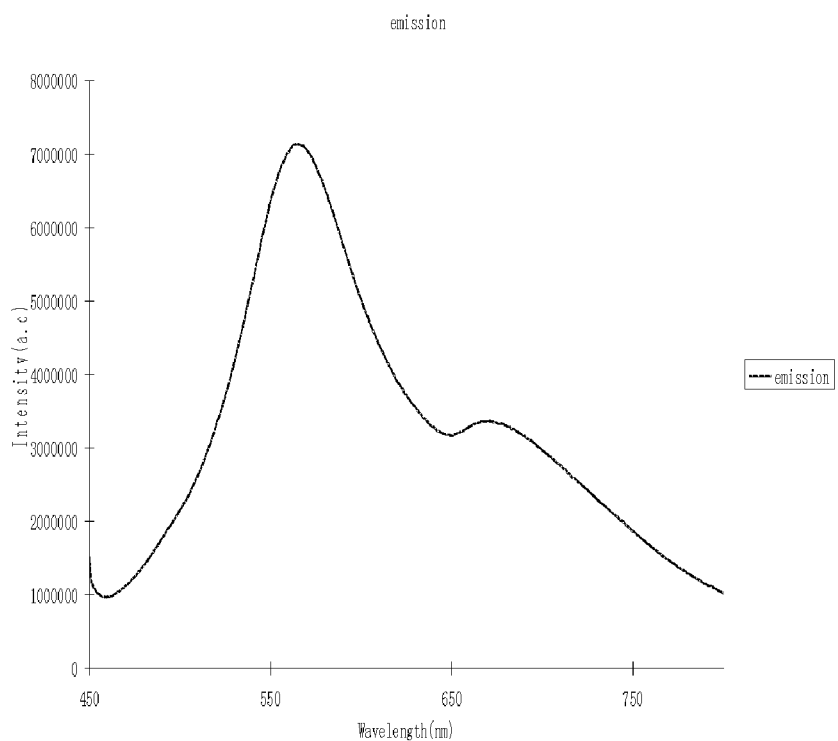

The reaction mixture was then left to anneal for 1 hour at 220° C. followed by cooling to room temperature. 100 ml of dry warm ethanol was then added to gave a precipitate of orange/red particles, these particles were isolated by centrifugation, washed with acetone and left to dry. Mass of product=3.2844 g. UV-vis spectrum of the ZnS/InP core/shell particles is shown in FIG. 10A. PL spectrum of the ZnS/InP core/shell particles is shown in FIG. 10B.

Preparation of Core-Shell ZnSe/InP

Figure 11A:
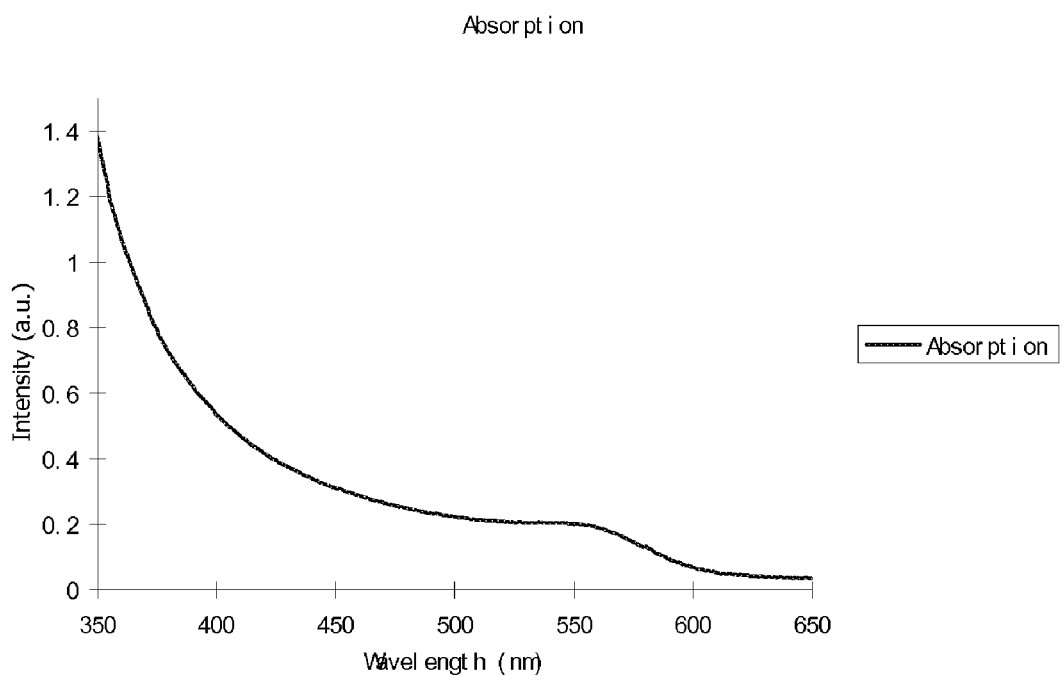
FIGS. 11A and 11B show PL and absorption spectra of ZnS/InP/ZnS quantum well nanocrystals.
Figure 11B:
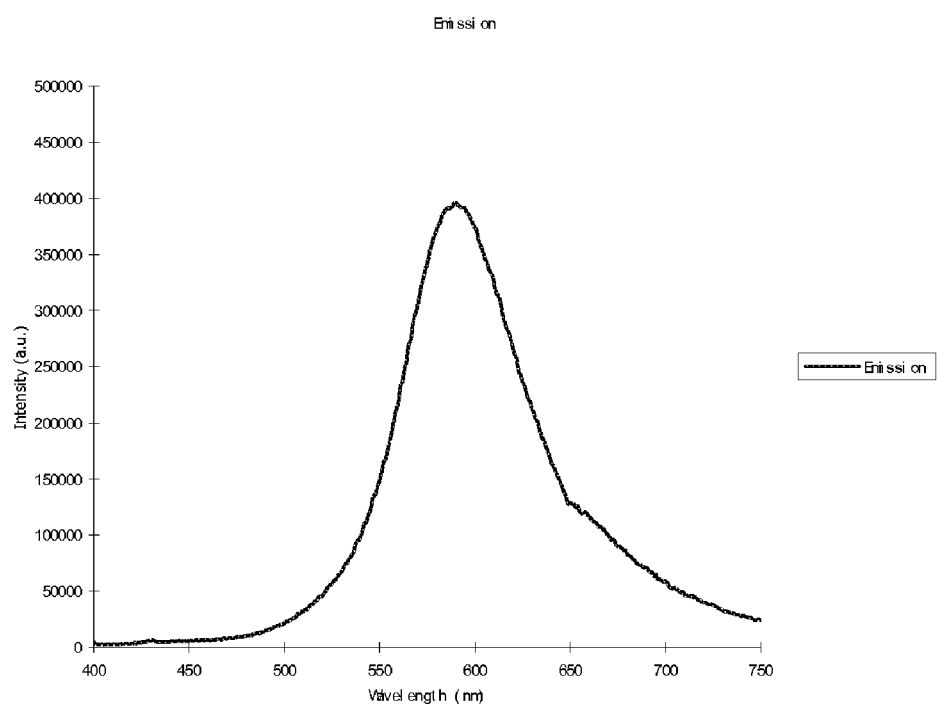

Dibutyl ester (50 ml) and stearic acid (5.65 g) were placed in a three neck flask and dried and degassed for one hour at a temperature of 90° C. The temperature was increased to 180° C. with addition of ZnSe particles (0.5 g), $(TMS)_3P$ (1.125 ml) and $InMe_3$ (1.125 ml). The solution was left at 180° C. for 10 mins followed by increasing the temperature to 200° C. At 200° C. a further addition of $(TMS)_3P$ (2.25 ml) and $InMe_3$ (2.25 ml) was made. The temperature was then increased to 220° C. followed by a final addition of $(TMS)_3P$ (3.375 ml) and $InMe_3$ (3.375 ml). The reaction mixture changed colour from orange/yellow to dark red and was left to anneal for one hour at 220° C. before cooling to room temperature. 100 ml of dry warm ethanol was then added to the reaction solution to give a precipitate of orange/red particles, which were isolated by centrifugation, washed with acetone and left to dry. Mass of product=3.33 g Final Shelling Preparation of ZnS/InP/ZnS HDA (150 g) was placed in a 3 neck flask and dried and degassed for one hour the temperature was then increased to 200° C. In a separate flask core-shell particles of ZnS/InP (with an orange emission) (2.6343 g) were dissolved in Dibutyl ester (5 ml) and placed under vacuum for 20 mins this was followed by sonication for 5 mins, this was followed by the addition of $(TMS)_3S$ (3.75 ml). This solution was then added to the HDA solution dropwise followed by the addition of $Zn(Et_2)$ dissolved TOP (7.50 ml). The reaction mixture was left at 200° C. for 26 hours. After 26 hours some luminescence was observed. The temperature was then decreased to room temperature followed by the addition of chloroform. The reaction solution was then filtered through Celite. The QD-QW's were then isolated under nitrogen by addition of warm dry methanol followed by centrifugation. UV-vis spectrum of the ZnS/InP/ZnS core/shell/shell particles is shown in FIG. 11A. PL spectrum of the ZnS/InP/ZnS core/shell/shell particles is shown in FIG. 11B.

Preparation of ZnSe Quantum Dots

Alternative methods are set out below for preparing ZnSe quantum dots which can be further modified for use as cores in the preparation of core/multishell quantum dot-quantum wells as described above.

Molecular Cluster Method $[Et_3NH]_4[Zn_{10}Se_4(SPh)_{16}]$ (2.5 g) and 5 mmol TOP-Se were added to a stirred solution of HDA (55 g) under $N_2$ while at 100° C. using standard airless techniques. The temperature was then increased to 250° C. this was left to stir for 2 hours, the initial PL peak of ZnSe was at 385 nm. $Zn(Et)_2$ and further quantities of and TOP-Se precursors were added to the reaction solution while the temperature was slowly increased to 290° C. Further quantities of $Zn(Et)_2$ and TOP-Se were added while the temperature was kept at 290° C. The growth of ZnSe was followed by monitoring the evolution of UV-Vis absorption and PL emission.

Figure 12:
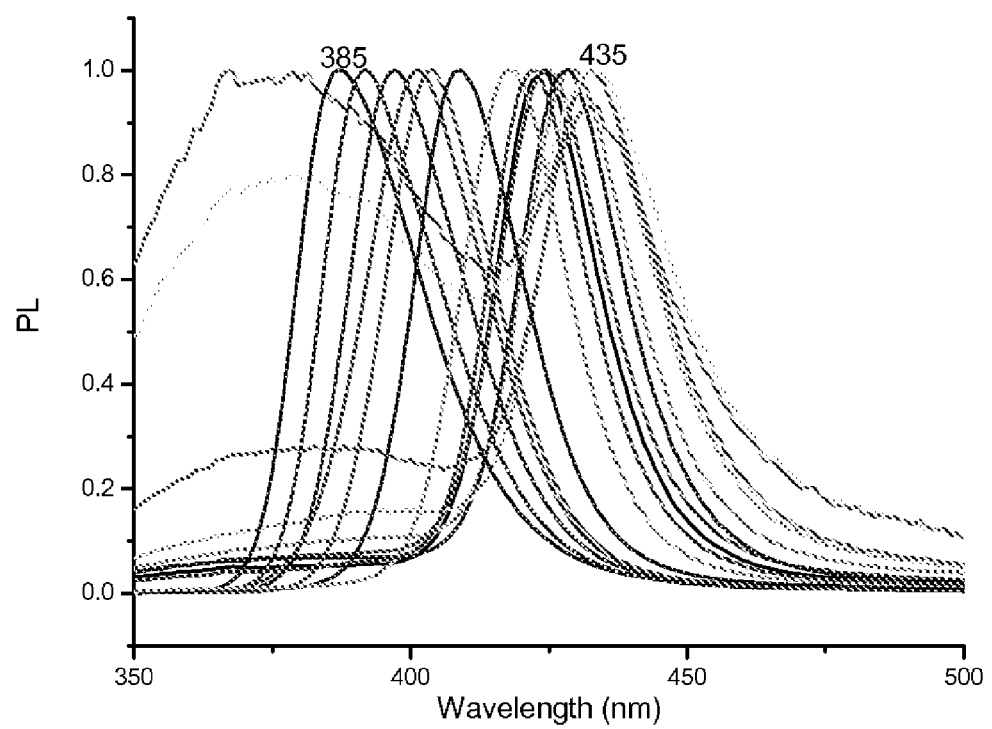
FIG. 12 shows a PL spectrum for the growth of ZnSe quantum dots.

1. 1 ml TOP-Se (0.5M) and 1 ml $Zn(Et)_2$ (0.5M) was slowly injected into the above reaction solution at 290° C., and then kept at 290° C. for 30 mins. The obtained PL is 393 nm.
2. 2 ml TOP-Se (0.5M) and 2 ml $Zn(Et)_2$ (0.5M) was added into the reaction solution at 290° C. and then kept at 290° C. for 60 mins. The obtained PL is 403 nm.
3. Additional of 2 ml, 2 ml, 3 ml and 3 ml etc of the same stock solution was dropwise injected into reaction solution by the same reaction condition.
4. The PL peak will be the red-shift with the multi-injection of $Zn(Et)_2$ and TOP-Se precursors and the longer annealing time. The maximum finial PL peak can reach to 435 nm (See FIG. 12).
5. Total 20 mmol TOP-Se and $Zn(Et)_2$ were used to make ZnSe nanoparticles.
6. The final ZnSe nanoparticle was collected by size selective precipitation with hot butanol (70° C.), centrifugation and then redispersed in octane. Excess HDA was completely removed by repeating those previous steps. The particles were re-dispersed in toluene, hexane, heptane and octane, resulting in clear nanoparticle solution.

The PL peak width of ZnSe product by this method is as narrow as 16 nm with a QY of 10~20%.

Preparation of ZnSe Quantum Dots

Dual Source Precursor Method

ZnSe quantum dots were prepared by using the injection of 5 ml $Zn(Et)_2$ (0.5M) and 5 ml TOP-Se (0.5M) into ODA at 345° C.

After obtaining the ZnSe quantum dots, the multi-injection of $Zn(Et)_2$ and TOP-Se precursors for the growth of larger ZnSe nanoparticles was analogous to the above Cluster Method for the production of ZnSe quantum dots.

The PL peak width of ZnSe product by this method is as narrow as 20 nm with a QY of 10~30%.

REFERENCES (1) Perspectives on the Physical Chemistry of Semiconductor Nanocrystals, Alivisatos, A. P.; *J. Phys. Chem.* 1996, 100, 13226.
(2) Synthesis and characterization of nearly monodisperse CdE (E=sulfur, selenium, tellurium) semiconductor nanocrystallites, Murray, C. B.; Norris, D. J.; Bawendi, M. G. *J. Am. Chem. Soc.* 1993, 115, 8706.
(3) Process for preparing a nano-crystalline material, international filing date 9 Aug. 1996, PCT/GB96/01942.
(4) GB Patent, Preparation of Nanoparticle Materials, PCT/GB2005/001611
(5) "New Zinc and Cadmium Chalcogenide Structured Nanoparticles" S. M. Daniels, P. O'Brien, N. L. Pickett, J. M. Smith, Mat. Res. Soc. Symp. Proc. Vol. 789, 2004.
(6) A. Mews, A. Eychmuller, M. Giersig, D. Schooss, H. Weller, J. Phys. Chem. 1994, 98, 934.
(7) "Colloidal Two-dimensional Systems: CdSe Quantum Shell and Wells" David Battaglia, Jack J. Li, Yunjun Wang, Xiaogang Peng, Angew. Chem. 2003, 115, 5189.
(8) "Formation of Quantum-dot quantum-well heteronanostructures with large lattice mismatch: Zn/CdS/ZnS" Reginald B. Little, Mostafa A. El-Sayed, Garnett W. Bryant, Susan Burke, J. Chem. Phys., Vol. 114, No. 4, 2001.
(9) "Synthesis and Characterization of Colloidal $CuInS_2$ Nanoparticles from a Molecular Single-Source Precursors" S. L. Costro, S. G. Bailey. R P. Raffaelle, K. K. Banger, A. F. Hepp, J. Phys. Chem. B. 2004, 108, 12429.
(10) "Synthesis of Mixed Copper-Indium Chalcogenolates. Single-Source Precursors for the Photovoltaic Materials $CuInQ_2$ (Q=S, Se)" W. Hirpo, S. Dhingra, A. C. Sutorik, M. G. Kanatzidis, J. Am. Chem. Soc. 1993, 115, 1597.
(11) "A Novel Route for the Preparation of CuSe and $CuInSe_2$ Nanoparticles" M. A. Malik, P. O'Brien, N. Revaprasadu, Adv. Mater. 1999, 11, No 17, 1441.
(12) "The Growth of Indium Selenide Thin Films from a Novel Asymmetric Dialkydiselenocarbamate" P. O'Brien, D. J. Otway, J. R. Walsh, Chem. Vap. Deposition 1979, 3, No. 4, 227.

The invention claimed is:

1. A method for producing a nanoparticle comprised of a core comprising a core semiconductor material, a first layer comprising a first semiconductor material provided on said core and a second layer comprising a second semiconductor material provided on said first layer, said core semiconductor material being different to said first semiconductor material and said first semiconductor material being different to said second semiconductor material, the method comprising:

effecting conversion of a nanoparticle core precursor composition to the material of the nanoparticle core;

depositing said first layer on said core; and depositing said second layer on said first layer, said core precursor composition comprising a first precursor species containing a first ion to be incorporated into the growing nanoparticle core and a separate second precursor species containing a second ion to be incorporated into the growing nanoparticle core, said conversion being effected in the presence of a molecular cluster compound different from the nanoparticle core precursor composition.

2. The method of claim 1, wherein a ratio of the number of moles of cluster compound compared to a total number of moles of the first and second precursor species lies in the range 0.0001-0.1:1.

3. The method of claim 1, wherein a molar ratio of the first precursor species to the second precursor species lies in the range 100-1:1.

4. The method of claim 1, wherein the molecular cluster compound and the core precursor composition are dispersed in a dispersing medium at a first temperature and a temperature of the dispersing medium containing the cluster compound and the core precursor composition is then increased to a second temperature greater than the first temperature.

5. The method of claim 4, wherein the first temperature is in the range 50° C. to 100° C.

6. The method of claim 4, wherein the second temperature is in the range 120° C. to 280° C.

7. The method of claim 1, the method comprising:

a. dispersing the molecular cluster compound and an initial portion of the nanoparticle core precursor composition which is less than a total amount of the core precursor composition to be used to produce said nanoparticle cores in a suitable dispersing medium at a first temperature;

b. increasing a temperature of the dispersing medium containing the cluster compound and the core precursor composition to a second temperature greater than the first temperature; and c. thereafter, adding one or more further portions of the core precursor composition to the dispersing medium containing the growing nanoparticle cores, wherein the temperature of the dispersing medium containing the growing nanoparticle cores is further increased above the second temperature at least one of before, during, or after the addition of the initial portion or each further portion of the nanoparticle core precursor composition.

8. The method of claim 7, wherein the temperature of the dispersing medium containing the growing nanoparticle cores is increased to the second temperature at a rate in the range 0.05° C./min to 1° C./min.

9. The method of claim 7, wherein said first temperature is in the range 15° C. to 60° C.

10. The method of claim 7, wherein said second temperature is in the range 90° C. to 150° C.

11. The method of claim 7, wherein the initial portion or each further portion of the nanoparticle core precursor composition is added dropwise to the dispersing medium containing the growing nanoparticle cores.

12. The method of claim 7, wherein said initial portion of the nanoparticle core precursor composition is less than or equal to approximately 90% of the total amount of the nanoparticle core precursor composition to be used to produce said nanoparticle cores.

13. The method of claim 7, wherein one further portion of the nanoparticle core precursor composition is added to the dispersing medium containing the growing nanoparticle cores and said one further portion is less than or equal to approximately 90% of the total amount of the nanoparticle core precursor composition to be used to produce said nanoparticle cores.

14. The method of claim 7, wherein a plurality of further portions of the nanoparticle core precursor composition is added to the dispersing medium containing the growing nanoparticle cores and each of said further portions is less than or equal to approximately 45% of the total amount of the nanoparticle core precursor composition to be used to produce said nanoparticle cores.

15. The method of claim 7, wherein formation of said molecular cluster compound is effected in situ in said dispersing medium prior to dispersing the molecular cluster compound and the initial portion of the nanoparticle core precursor composition in said dispersing medium.

16. The method of claim 1, wherein conversion of the core precursor composition to the nanoparticle core is effected in a reaction medium and said nanoparticle core is isolated from said reaction medium prior to deposition of the first layer.

17. The method of claim 1, wherein:

a) at least two of the core, first shell and second shell materials incorporate ions from groups 12 and 15 of the periodic table, groups 14 and 16 of the periodic table, or groups 11, 13 and 16 of the periodic table; or b) the second shell material incorporates ions of at least two different elements from group 12 of the periodic table and ions from group 16 of the periodic table; or c) at least one of the core, first and second semiconductor materials incorporates ions from groups 11, 13 and 16 of the periodic table and at least one other of the core, first and second semiconductor materials is a semiconductor material not incorporating ions from groups 11, 13 and 16 of the periodic table.

* * * * *